United States Patent
Fukumoto et al.

(10) Patent No.: US 7,379,280 B2
(45) Date of Patent: May 27, 2008

(54) MAGNETIC TUNNEL MAGNETO-RESISTANCE DEVICE AND MAGNETIC MEMORY USING THE SAME

(75) Inventors: Yoshiyuki Fukumoto, Tokyo (JP); Ken-ichi Shimura, Tokyo (JP); Atsushi Kamijo, Tokyo (JP)

(73) Assignee: NEC Corporation, Tokyo (JP)

( * ) Notice: Subject to any disclaimer, the term of this patent is extended or adjusted under 35 U.S.C. 154(b) by 70 days.

(21) Appl. No.: 10/539,373
(22) PCT Filed: Dec. 16, 2003
(86) PCT No.: PCT/JP03/16067

§ 371 (c)(1),
(2), (4) Date: Jun. 16, 2005

(87) PCT Pub. No.: WO2004/055914

PCT Pub. Date: Jul. 1, 2004

(65) Prior Publication Data

US 2006/0056114 A1    Mar. 16, 2006

(30) Foreign Application Priority Data

Dec. 16, 2002 (JP) .............................. 2002-364350

(51) Int. Cl.
*G11B 5/39* (2006.01)
(52) U.S. Cl. .................................. 360/324.2
(58) Field of Classification Search .............. 360/324.2
See application file for complete search history.

(56) References Cited

U.S. PATENT DOCUMENTS

| | | |
|---|---|---|
| 5,986,858 A | 11/1999 | Sato et al. |
| 5,998,016 A | 12/1999 | Sasaki et al. |
| 6,544,801 B1 | 4/2003 | Slaughter et al. |
| 6,611,405 B1 | 8/2003 | Inomata et al. |
| 6,710,987 B2 | 3/2004 | Sun et al. |

(Continued)

FOREIGN PATENT DOCUMENTS

EP    1033764 A2    9/2000

(Continued)

OTHER PUBLICATIONS

K. Matsuda et al.; "Reduced magnetoresistance in magnetic tunnel junctions caused by geometrical artifacts"; Applied Physics Letters; vol. 77, No. 19; Nov. 6, 2000; pp. 3060-3062.

(Continued)

*Primary Examiner*—A. J. Heinz
(74) *Attorney, Agent, or Firm*—Sughrue Mion, PLLC

(57) ABSTRACT

A magneto-resistance device is composed of an anti-ferromagnetic layer (5), a pinned ferromagnetic layer (20), a tunnel insulating layer (9) and a free ferromagnetic layer (21). The pinned ferromagnetic layer (20) is connected to the anti-ferromagnetic layer (5) and has a fixed spontaneous magnetization. The tunnel insulating layer (9) is connected to the pinned ferromagnetic layer (20) and is non-magnetic. The free ferromagnetic layer (21) is connected to the tunnel insulating layer (9) and has a reversible free spontaneous magnetization. The pinned ferromagnetic layer (20) has a first composite magnetic layer (6) to prevent at lest one component of the anti-ferromagnetic layer (5) from diffusing into tunnel insulating layer (9).

24 Claims, 16 Drawing Sheets

U.S. PATENT DOCUMENTS

| | | | |
|---|---|---|---|
| 6,801,414 B2 * | 10/2004 | Amano et al. | 360/324.2 |
| 6,897,532 B1 | 5/2005 | Schwarz et al. | |
| 6,903,909 B2 * | 6/2005 | Sharma et al. | 360/324.2 |
| 7,009,266 B2 | 3/2006 | Shi et al. | |
| 7,205,564 B2 | 4/2007 | Kajiyama | |
| 7,215,566 B2 | 5/2007 | Kanegae | |
| 7,264,974 B2 * | 9/2007 | Horng et al. | |
| 2002/0044396 A1 | 4/2002 | Amano et al. | |
| 2002/0102828 A1 | 8/2002 | Schlosser | |
| 2003/0134096 A1 * | 7/2003 | Chen et al. | |
| 2003/0179601 A1 | 9/2003 | Seyyedy et al. | |
| 2004/0145850 A1 | 7/2004 | Fukumoto et al. | |
| 2004/0156232 A1 | 8/2004 | Saito et al. | |
| 2005/0219769 A1 | 10/2005 | Shimura et al. | |
| 2005/0276099 A1 * | 12/2005 | Horng et al. | |

FOREIGN PATENT DOCUMENTS

| | | |
|---|---|---|
| EP | 1202357 A2 | 5/2002 |
| JP | 62-132211 A | 6/1987 |
| JP | 2-195284 A | 8/1990 |
| JP | 3-268216 A | 11/1991 |
| JP | 10-65232 A | 3/1998 |
| JP | 10-269532 A | 10/1998 |
| JP | 2000-20922 A | 1/2000 |
| JP | 2001-14843 A | 1/2001 |
| JP | 2001-84756 A | 3/2001 |
| JP | 2001-237471 A | 8/2001 |
| JP | 2002-25013 A | 1/2002 |
| JP | 2002-74627 A | 3/2002 |
| JP | 2002-158381 A | 5/2002 |
| JP | 2002-163810 A | 6/2002 |
| JP | 2002-329903 A | 11/2002 |
| JP | 2003-273420 A | 9/2003 |
| JP | 2003-324187 A | 11/2003 |
| JP | 2004-519859 A | 7/2004 |
| WO | WO 01/71735 A1 | 9/2001 |

OTHER PUBLICATIONS

J. S. Moodera et al.; "Geometrically enhanced magnetoresistance in ferromagnet-insulator-ferromagnet tunnel junctions"; Applied Physics Letters; vol. 69, No. 5; Jul. 29, 1996; pp. 708-710.

S. Ohnuma et al.; "Soft Magnetic Films with High Electrical Resistivity"; Journal of the Magnetics Society of Japan; vol. 19, No. 1; 1995; pp. 19-25; with English Abstract.

S. Cardoso et al., Influence of Ta antidiffusion barriers on the thermal stability of tunnel junctions, Applied Physics Letters (vol. 78, May 7, 2001, pp. 2911-2913)(the second conventional example).

J.J. Sun et al., Low resistance and high terminal stability of spin-dependent tunnel junctions with synthetic antiferromagnetic CoFe/Ru/CoFe pinned layers, Applied Physics Letters (vol. 76, Apr. 24, 2000, pp. 2424-2426).

S. Cardoso et al., Influence of Ta antidiffusion barriers on the thermal stability of tunnel junctions, Applied Physics Letters (vol. 76, Jun. 19, 2000, pp. 3792-3794).

T. Ochiai et al., Improved Thermal Stability of Ferromagnetic Tunnel Junctions With a CoFe/CoFeOz/CoFe Pinned Layer, IEEE Transactions on Magnetics, (vol. 39, Sep. 2003, pp. 2797-2799).

Applied Physics Letters (vol. 78, May 7, 2001, pp. 2911-2913)(the second conventional example), Zongzhi Zhang, et al..

J.J. Sun et al., Low resisitance and high terminal stability of spin-dependent tunnel junctioins with synthetic antiferromagnetic CoFe/Ru/CoFe pinned layers, Applied Physics Letters (vol. 76, Apr. 24, 2000, pp. 2424-2426).

S. Cardoso et al., Influence of Ta antidiffusion barriers on the thermal stability of tunnel junctions, Applied Physics Letters (vol. 76, Jun. 19, 2000, pp. 3792-3794).

T. Ochiai et al., Improved Thermal Stability of Ferromagnetic Tunnel Junctions With a CoFe/CoFeOx/CoFe Pinned Layer, IEEE Transactions on Magnetics, (vol. 39, Sep. 2003, pp. 2797-2799).

* cited by examiner

Fig. 17

| SAMPLE NAME | THERMAL TREATMENT TEMPERATURE, MR RATIO (%) AND EXCHANGE COUPLING MAGNETIC FIELD Hex (Oe) | | | | | | | | |
|---|---|---|---|---|---|---|---|---|---|
| | 250°C | | 300°C | | 350°C | | 400°C | |
| | MR RATIO | Hex | MR RATIO | Hex | MR RATIO | Hex | MR RATIO | Hex |
| SAMPLE 8 | 42% | 1100e | 26% | 1100e | 15% | 1130e | 4% | 1200e |
| SAMPLE 9 | 41% | 800e | 44% | 850e | 41% | 880e | 18% | 920e |
| SAMPLE 10 | 39% | 2300e | 41% | 2200e | 33% | 2400e | 13% | 3100e |

US 7,379,280 B2

MAGNETIC TUNNEL MAGNETO-RESISTANCE DEVICE AND MAGNETIC MEMORY USING THE SAME

This application is related to application Ser. No. 10/697,124 (U.S. Patent Publication No. 2004-0145850) filed Oct. 31, 2003.

TECHNICAL FIELD

The present invention relates to a magnetic tunnel element (a magneto-resistance device) and a manufacturing method of a magneto-resistance device, and more particularly relates to a magnetic tunnel element (a magneto-resistance device) including a magnetic tunnel junction (MTJ) to show a tunnel magneto-resistance (TMR) effect, to the manufacturing method of the same, and to a magnetic memory using the same.

BACKGROUND ART

In recent years, a magnetic head and MRAM (magnetoresistive Random Access Memory) using a magneto-resistance element to show GMR (Giant Magneto-Resistance) effect have been developed. The magneto-resistance element used in such devices has a structure called spin valve, and includes an anti-ferromagnetic layer/a ferromagnetic layer/a nonmagnetic layer/a ferromagnetic layer. When the nonmagnetic layer is a conductive layer formed of material such as Cu, the structure is called a spin-valve type GMR, and when the nonmagnetic layer is an insulating layer, the structure is called a spin-valve type TMR (Tunnel Magneto-Resistance).

FIG. 1 shows a sectional view of a spin-valve type TMR magneto-resistance device. With reference to FIG. 1, the magneto-resistance device includes a lower layer 124 as an electrode formed on a substrate 101; an anti-ferromagnetic layer 123; a pinned ferromagnetic layer 120; a tunnel insulating layer 122; a free ferromagnetic layer 12; and a surface layer 125. The pinned ferromagnetic layer 120 has a spontaneous magnetization whose magnetization direction is fixed, and the free ferromagnetic layer 121 has a spontaneous magnetization whose magnetization direction can be inverted. In order to firmly fix the direction of the spontaneous magnetization, the pinned ferromagnetic layer 120 is often formed to be connected to the anti-ferromagnetic layer 123. Consequently, the magnetization is firmly fixed to one direction based on an exchange bias from the anti-ferromagnetic layer 123. Exchange interaction that the anti-ferromagnetic layer 123 provides for the pinned ferromagnetic layer 120, firmly fixes the spontaneous magnetization of the pinned ferromagnetic layer 120. The anti-ferromagnetic layer 123 is generally formed of an anti-ferromagnetic material (Mn-based alloy) containing Mn, such as IrMn and PtMn. Also, the free ferromagnetic layer 121 is often formed of a hard ferromagnetic layer 121b formed of a ferromagnetic material having a high spin polarization rate, and a soft ferromagnetic layer 121a formed of a soft ferromagnetic material. Such a structure of the free ferromagnetic layer 121 makes it possible to facilitate the inversion of the spontaneous magnetization of the free ferromagnetic layer, while increasing a magneto-resistance change rate (a MR rate) of the magnetic tunnel junction. In general, the hard ferromagnetic layer 121b is formed of a ferromagnetic material containing Co, such as Co and CoFe. The soft ferromagnetic layer 121a is generally formed of a ferromagnetic material containing Ni (Ni alloy) such as NiFe, which has small magnetization and soft magnetism. The tunnel insulating layer 122 as a nonmagnetic layer is formed as a very thin insulating film to an extent that tunnel current can flow through it. The tunnel insulating layer 122 is generally formed of an insulator such as $AlO_x$. The lower layer 124 and the surface layer 125 function as electrodes of the magneto-resistance elements.

In the TMR element, the current flows in the vertical direction to the film surface. The magnetization direction of the free ferromagnetic layer is rotated to a magnetic field direction by an external magnetic field, and the resistance of the magneto-resistance element is changed depending on a relative magnetization angle between the free ferromagnetic layer and the pinned ferromagnetic layer.

One of the problems in using the TMR element as an MRAM element is a thermal stability. It is necessary for manufacture of the MRAM to use a process of manufacturing a semiconductor device. For example, in a process of forming a wiring line and an insulating film, and in a thermal treatment process in hydrogen atmosphere for improving the performance of a transistor, it is assumed that the temperature of nearly 400° C. is applied to the TMR element. The conventional TMR element has a low heat resistant temperature of 300° C. Therefore, if these processes are applied as they are to the MRAM including the TMR elements, an elements characteristic is deteriorated. One of the reasons of the deterioration is diffusion between layers of the magneto-resistance elements when the high temperature is applied to the magneto-resistance elements.

As described above, when the conventional TMR element is used as the MRAM element, it is always necessary to consider the thermal treatment temperature in the manufacturing process. Therefore, available device structures and manufacturing processes are limited. In this way, it is demanded to improve a thermal resistance of the TMR element in order to achieve a high-performance MRAM with excellent reliability and to reduce a manufacturing cost. The thermal resistance of up to approximately 400° C. is desired.

For example, in Japanese Laid Open Patent Application (JP-P2000-20922A: a first conventional example), the diffusion between the soft ferromagnetic layer and the hard ferromagnetic layer in a free layer is described. A problem pointed out here is the diffusion of Ni contained in the soft ferromagnetic layer into the hard ferromagnetic layer. The diffusion of Ni into the hard ferromagnetic layer deteriorates the characteristic of the magneto-resistance element. In the first conventional example, an oxide film or a nitride film formed of nonmagnetic elements is provided between the hard ferromagnetic layer and the soft ferromagnetic layer to prevent the interdiffusion.

However, when the hard ferromagnetic layer and the soft ferromagnetic layer are separated by such an oxide film and the like, the magnetic coupling is extremely weakened sometimes since direct exchange interaction between the above two layers is lost. Coercive force of the free ferromagnetic layer becomes large even if the diffusion preventing layer is thinned exceedingly. As a result, steepness in magnetization inversion might be lost.

In Applied Physics Letters (Vol. 78, May 7, 2001, pp. 2911-2913) (the second conventional example), Zongzhi Zhang, et al., report a TMR element that shows a high MR ratio even after a thermal treatment at a high temperature, by forming an oxide layer of ferromagnetic elements such as $FeO_x$, $CoFeO_x$, and the like, between the pinned ferromagnetic layer and the tunnel insulating layer. In this method, however, the oxide layer of the ferromagnetic elements decreases the MR ratio and increases the junction resistance. This is because the oxide of the ferromagnetic element, e.g., $CoO_x$, is an anti-ferromagnetic insulator, which functions as a tunnel barrier of undesirable property that causes a leakage current not depending on a spin, and a spin scattering of tunneling electrons. In addition, $CoO_x$, $FeO_x$, and $NiO_x$, as the oxides of Co, Fe, and Ni have high oxide generation free energy and are instable, and are decomposed in a temperature range of 300° C. to 350° C. Therefore, it is difficult to obtain a thermal resistance of near to 400° C.

In Japanese Laid Open Patent Application (JP-P2001-237471A) (a third conventional example), an oxide magnetic layer is inserted in the pinned ferromagnetic layer and the free ferromagnetic layer in a spin valve type GMR element, in order to improve thermal stability of exchange coupling of the pinned ferromagnetic layer, and to increase the MR ratio through increase in resistance of the magnetic layer. An oxide magnetic layer is used such as $Fe_3O_4$ and $CoFe_2O_4$ containing iron oxide as a main component and they are added with Si, Al, B, N, Y, and La. In such a spin valve type GMR element that electric current flows in a plane, the high resistance of the pinned ferromagnetic layer prevents the distribution of the electric current out of the conductive layer in the spin valve type GMR element other than the nonmagnetic layer, and the MR ratio can be increased. However, in the TMR element in which the electric current flows in the direction perpendicular to the plane and a magnetoresistance effect of the tunneling current is important, the above-mentioned effect of increasing the MR ratio cannot be expected. Oppositely, in the oxide magnetic layer functions as a series resistance that does not contribute to the tunneling magneto-resistance in the TMR element. Therefore, all the element resistances increase, so that S/N (signal-to-noise) ratio is decreased.

In Japanese Laid Open Patent Application (JP-P2002-158381A) (a forth conventional example), a problem is pointed out that Mn diffuses from the anti-ferromagnetic material containing Mn into the pinned ferromagnetic layer. In the fourth conventional example, the pinned ferromagnetic layer is formed from two ferromagnetic layers and an insulating layer or an amorphous magnetic layer (a diffusion preventing layer) that is provided between the above-mentioned ferromagnetic layers. Thus, Mn is prevented from diffusing into the pinned ferromagnetic layer.

However, in such a diffusion prevention layer, the metal ferromagnetic layer is separated by the diffusion preventing layer, which causes the following problems. When the insulating layer formed of oxide is used as the diffusion preventing layer, the resistance of the diffusion preventing layer is also added in series to the tunneling magneto-resistance, and functions as an additional resistance. In this case, the S/N (signal-to-noise) ratio of the output of the TMR element decreases. In addition, when the insulating layer of the oxide of the non-magnetic element is used as the diffusion preventing layer, the magnetic coupling between the two separated ferromagnetic layers is exceedingly weakens even if the diffusion preventing layer becomes thinner. As a result, the magnetization of the pinned ferromagnetic layer is not fixed to one direction. Even in case that the diffusion preventing layer is the insulating layer that contains the oxide of the ferromagnetic element, only $Fe_{3-x}O_4$ ($0<x<\frac{1}{3}$) indicates the ferromagnetism, which includes $(CoFe_2)O_4$ (Co ferrite), $Fe_3O_4$ (magnetait), and $\gamma$-$Fe_2O_3$ (maghematait) having a spinel structure. The other oxides of ferromagnetic elements are an anti-ferromagnetic material or a paramagnetic material. Moreover, even if the diffusion preventing layer is formed of a spinel oxide ferromagnetic substance, there is a problem of the thermal instability that oxygen decouples easily at a high temperature as mentioned above.

Further, the amorphous magnetic layer is in a non-equilibrium state and tends to be changed generally into a more stable state (e.g., through crystallization, including a material of peripheral film) in application of heat. The tendency greatly depends on the material. Therefore, it cannot be always said that the amorphous magnetic layer itself is effective for the diffusion prevention.

As mentioned in the first to fourth conventional examples, in the magneto-resistance element, in which the oxide layer of the non-magnetic element or the oxide layer of the ferromagnetic element is inserted, there are the problems such as the deterioration of MR characteristic, the low thermal stability, the increase of the resistance through the insertion of the oxide layer, the decrease of the S/N (signal-to-noise) ratio due to the increase of the resistance, and the remarkable decrease of the ferromagnetic coupling between the two ferromagnetic layers separated by the oxide layer. Therefore, it has been necessary to prevent the diffusion and solve these problems at the same.

As the result of examining the thermal deterioration mechanism of the MR element in the thermal treatment at approximately 400° C., the inventors of the present invention found that Ni in the free ferromagnetic layer diffuses into the tunnel insulating layer (tunnel barrier) at the high temperature, and the diffusion of Mn in the anti-ferromagnetic layer into the tunnel insulating layer especially cause of the thermal deterioration. Since Ni and Mn diffuse at a relatively low temperature, the deterioration of the tunnel insulating layer due to the diffusion of Ni and Mn is serious.

Therefore, a technique is demanded that diffusion of Ni in the free ferromagnetic layer into the tunnel insulating layer (tunnel barrier) at the high temperature can be prevented without losing the characteristic of the TMR element in a stable state. Further, a technique is demanded that the diffusion of Mn in the anti-ferromagnetic layer into the tunnel insulating layer can be prevented.

In conjunction with the above-mentioned description, a thin film magnetic head is disclosed in Japanese Laid Open Patent Application (JP-A-Showa 62-132211). In this conventional thin film magnetic head, the change in an applied signal magnetic field is detected as a change in the resistance of a ferromagnetic thin film having one-axis magnetic anisotropy. The thin film magnetic head has the ferromagnetic thin film formed between $SiO_2$ films.

Also, a composite bias magneto-resistance effect head is disclosed in Japanese Laid Open Patent Application (JP-A-Heisei 3-268216). In this conventional technique, the composite bias magneto-resistance effect head has a three-layer film of a permalloy thin film as a magneto-resistance effect film formed on substrate, a Nb thin film for shunt bias, and a soft magnetic bias film. A magneto-striction of the permalloy thin film is from $+2\times10^{-6}$ to $-2\times10^{-6}$.

Also, a magneto-resistance element is disclosed in Japanese Laid Open Patent Application (JP-P2002-190631A). In this conventional technique, the magneto-resistance element includes a middle layer and a pair of magnetic layers putting the middle layer therebetween. One of the magnetic layers is a pinned magnetic layer, which is hard to be magnetically inverted against external magnetic field, compared with the other magnetic layer. The pinned magnetic layer is a multi-layered film of at least one non-magnetic layer and magnetic layers putting the non-magnetic substance layer therebetween. The magnetic layers are magnetostatically or anti-ferromagnetically coupled through the non-magnetic substance layer. When the $m_{th}$ magnetic layer (m is an integer more than 0) from a middle layer side is referred to as a magnetic layer m, and the average saturation magnetization and the average film thickness of the magnetic layer m are assumed to be Mm and dm, respectively, 0.5<Mde/Mdo<1 is met, if a total summation of Mm*dm in case that m is an odd number is Mdo, and the total summation of Mm*dm in case that m is an even number is Mde.

DISCLOSURE OF INVENTION

Therefore, an object of the present invention is to provide a magneto-resistance device that thermal stability (thermal treatment resistance) is improved, a manufacturing method of the same, and a magnetic memory using the same.

Another object of the present invention is to provide a magneto-resistance device that while magnetic coupling and electrical contact are kept in each of a pinned ferromagnetic layer and a free ferromagnetic layer, diffusion of elements contained the layer, especially, Ni and Mn into a tunnel insulating layer can be prevented, a manufacturing method of the same, and a magnetic memory using the same.

Still another object of the present invention is to provide a magneto-resistance device that high performance and high reliability can be accomplished, a manufacturing method of the same that a manufacturing cost can be reduced, and a magnetic memory using the same.

In an aspect of the present invention, a magneto-resistance device is composed of an anti-ferromagnetic layer, a pinned ferromagnetic layer, a tunnel insulating layer and a free ferromagnetic layer. The pinned ferromagnetic layer is connected to the anti-ferromagnetic layer and has a fixed spontaneous magnetization. The tunnel insulating layer is connected to the pinned ferromagnetic layer and is non-magnetic. The free ferromagnetic layer is connected to the tunnel insulating layer and has a reversible free spontaneous magnetization. The pinned ferromagnetic layer is composed of a first composite magnetic layer functioning to prevent at least one component of the anti-ferromagnetic layer from diffusing into the tunnel insulating layer. In the above-mentioned magneto-resistance device, the anti-ferromagnetic layer contains Mn and the first composite magnetic layer has a function to prevent Mn from diffusing into the tunnel insulating film.

In the above-mentioned magneto-resistance device, the first composite magnetic layer is composed of ferromagnetic material which has been not oxidized and oxide of a material which is easy to bind with oxygen compared with the ferromagnetic material. In the above-mentioned magneto-resistance device, the ferromagnetic material contains Co as a main component.

In the above-mentioned magneto-resistance device, the first composite magnetic layer may be formed from an amorphous phase as whole and may be formed from the amorphous phase and a crystalline phase. The crystalline phase contains a plurality of crystalline regions and the plurality of crystalline regions pass through the first composite magnetic layer into a direction of the thickness of the first composite magnetic layer.

In the above-mentioned magneto-resistance device, the composition formula of the amorphous phase in the first composite magnetic layer is $D_zM_{1-z}O_x$ (0.6≦Z≦0.9, and X>0). Here, D is at least one element selected from the group consisting of Co, Fe and Ni, and M is at least one element selected from the group consisting of Ta, Zr, Hf, Nb, and Ce.

In the above-mentioned magneto-resistance device, the first composite magnetic layer contains a plurality of crystal grains formed of the ferromagnetic material and the plurality of crystal grains are separated from each other by the oxide. Also, a part of the plurality of crystal grains may be contact with another of the plurality of crystal grains.

In the above-mentioned magneto-resistance device, the oxide contains oxide of at least one element selected from the group consisting of Al, Si, the Mg and Ti.

In the above-mentioned magneto-resistance device, the first composite magnetic layer contains a plurality of crystal grains formed of the ferromagnetic material and the plurality of crystal grains are separated from each other by the oxide. Also, the plurality of crystal grains pass through the first composite magnetic layer into a direction of the thickness of the first composite magnetic layer. A part of the plurality of crystal grains may contact with another of the plurality of crystal grains. The oxide contains oxide of at least one element selected from the group consisting of Al, Si, the Mg, Ti, Ta, Hf, Zr, Nb and Ce.

In the above-mentioned magneto-resistance device, it is preferable that the thickness of the oxide is thinner than the grain diameter of each of the plurality of crystal grains, and it is preferable that the thickness of the oxide is equal to or less than 2 nm.

In the above-mentioned magneto-resistance device, the average grain diameter of the plurality of crystal grains is preferably equal to or less than 10 nm and the plurality of crystal grains are preferably ferromagnetically coupled.

In the above-mentioned magneto-resistance device, the pinned ferromagnetic layer contains a first metal ferromagnetic layer and a second metal ferromagnetic layer and the first composite magnetic layer is interposed between the first metal ferromagnetic layer and the second metal ferromagnetic layer. It is preferable that the resistivity of the first composite magnetic layer is in a range between 10 μΩcm and 3000 μΩcm.

In the above-mentioned magneto-resistance device, the free ferromagnetic layer is composed of a second composite magnetic layer functioning to prevent at least one component of the free ferromagnetic layer from diffusing into the tunnel insulating layer. The free ferromagnetic layer contains Ni and the second composite magnetic layer prevents Ni from diffusing into the tunnel insulating film.

In the above-mentioned magneto-resistance device, the free ferromagnetic layer is composed of a metal ferromagnetic layer and a soft magnetic layer. Here, the metal ferromagnetic layer is connected to the tunnel insulating layer on one side of the phase boundaries and is connected to the second composite magnetic layer on the other phase boundary side. The soft magnetic layer contains Ni and is joined to the phase boundary of the second composite magnetic layer opposite to the metal ferromagnetic layer.

In the above-mentioned magneto-resistance device, the pinned ferromagnetic layer is composed of a non-magnetic layer and two ferromagnetic layers anti-ferromagnetically through the non-magnetic layer, and the free ferromagnetic layer is composed of a non-magnetic layer and two ferromagnetic layers anti-ferromagnetically coupled through the non-magnetic layer.

In order to solve the above problems, I a method of manufacturing method of a magneto-resistance device of the present invention, an anti-ferromagnetic layer containing Mn is formed above a substrate and a pinned ferromagnetic layer with a fixed spontaneous magnetization is formed on the anti-ferromagnetic layer. Here, the pinned ferromagnetic layer is composed of a first composite magnetic layer functioning to prevent Mn from diffusing into the tunnel insulating layer. An insulative non-magnetic tunnel insulating layer is formed on the pinned ferromagnetic layer, and the free ferromagnetic layer with a reversible free spontaneous magnetization is formed on the tunnel insulating layer. The first composite magnetic layer is formed of ferromagnetic material which is not oxidized as a main component, and oxide of material that is easy to bind with oxygen compared with the ferromagnetic material, as a sub component.

In the formation of the pinned ferromagnetic layer in the above-mentioned method of manufacturing the magneto-resistance device, the first composite magnetic layer is formed by the reactive sputtering method in a mixture atmosphere of an inactive gas and an oxygen gas, by using a target which contains at least one of ferromagnetic material selected from the group consisting of Co, Ni and Fe and at least one of non-magnetic material selected from the group consisting of Al, Si, the Mg, Ti, Ta, Hf, Zr, Nb and Ce. At this time, in the reactive sputtering method, it is preferable that a ratio of a flow rate of the oxygen to a flow rate of the inactive gas is equal to or less than 0.2.

In order to improve the thermal resistance of a TMR device as the magneto-resistance device, a structure is effective in which a diffusion preventing layer is provided between a layer containing elements such as Mn and Ni easy to be diffused and a tunnel insulating layer, and such a material is not contained between the diffusion preventing layer and the tunnel insulating layer. In the present invention, an oxide layer contained in the diffusion preventing layer is effective to the diffusion prevention. The oxide has a high thermal reliability, a high density, and a large generation energy of the lattice defect, compared with non-oxide layer. Therefore, the diffusion coefficient of the magnetic atom to the oxide layer is small. In addition, Mn has a property to easily bind with oxygen, and stably bind with oxygen in an oxide and is captured in the oxide. Therefore, it is effective to prevention of Mn diffusion.

The ferromagnetic material in the composite magnetic layer as the diffusion preventing layer is almost in a metal state, and a strong magnetic coupling can be kept between the layers on the up and down sides connected with the composite magnetic layer by this metal ferromagnetic material and moreover the conductive state can be also kept. In this way, Mn is captured by the non-magnetic oxide (the oxide layer) which is contained in the composite magnetic layer and the diffusion of Mn is prevented. Here, it is preferable that the material of the non-magnetic oxide is easy to bind with oxygen, compared with the ferromagnetic material. This is to prevent that the ferromagnetic material is oxidized, through binding of oxygen with the material. Also, it is preferable that the non-magnetic oxide is stable at 400° C. This is to get the effect of the Mn capture at 400° C. As such a material, it is preferable to use a non-magnetic material of Hf, Zr, Nb, Ce, Al, Si, Mg, and Ti which are easy to bind with oxygen compared with the ferromagnetic material of Co, Fe and Ni and whose oxide is stable at 400° C. These non-magnetic materials have low oxide formation energies compared with the ferromagnetic material, and are easy to bind with oxygen.

It should be noted that the structure of the magneto-resistance device and the manufacturing method of it in the present invention is not limited to the TMR device. When a non-magnetic conductive layer is used in place to the tunnel insulating layer and the present invention is applied to the GMR device, the thermal resistance of a spin valve GMR device can be improved through the prevention effect of diffusion of Mn and Ni into the non-magnetic conductive layer in addition to the above.

BRIEF DESCRIPTION OF DRAWINGS

FIG. 17 is a table showing a relation of MR ratio and exchange coupling magnetic field in the magneto-resistance devices.

BEST MODE FOR CARRYING OUT THE INVENTION

Hereinafter, a magneto-resistance device of the present invention will be described with reference to the attached drawings.

Figure 1:
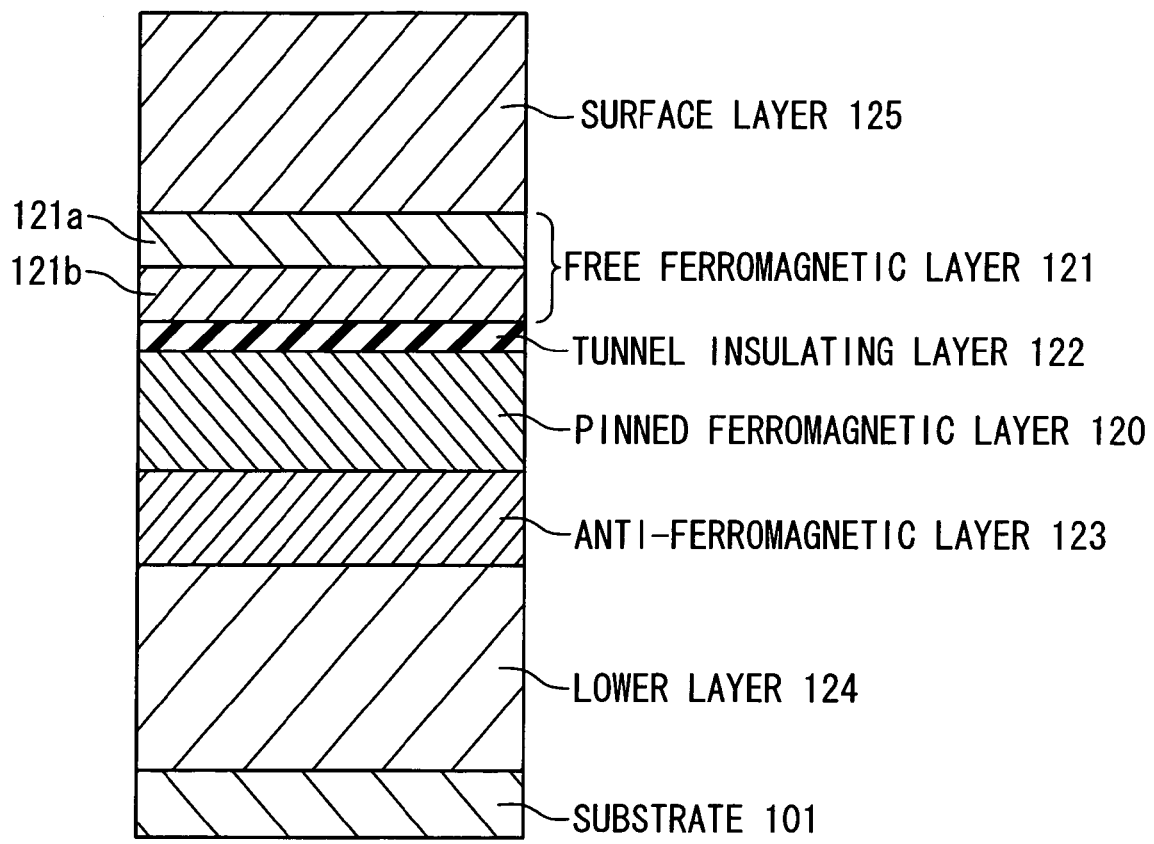
FIG. 1 is a sectional view showing a structure of a conventional magneto-resistance device.
Figure 2:
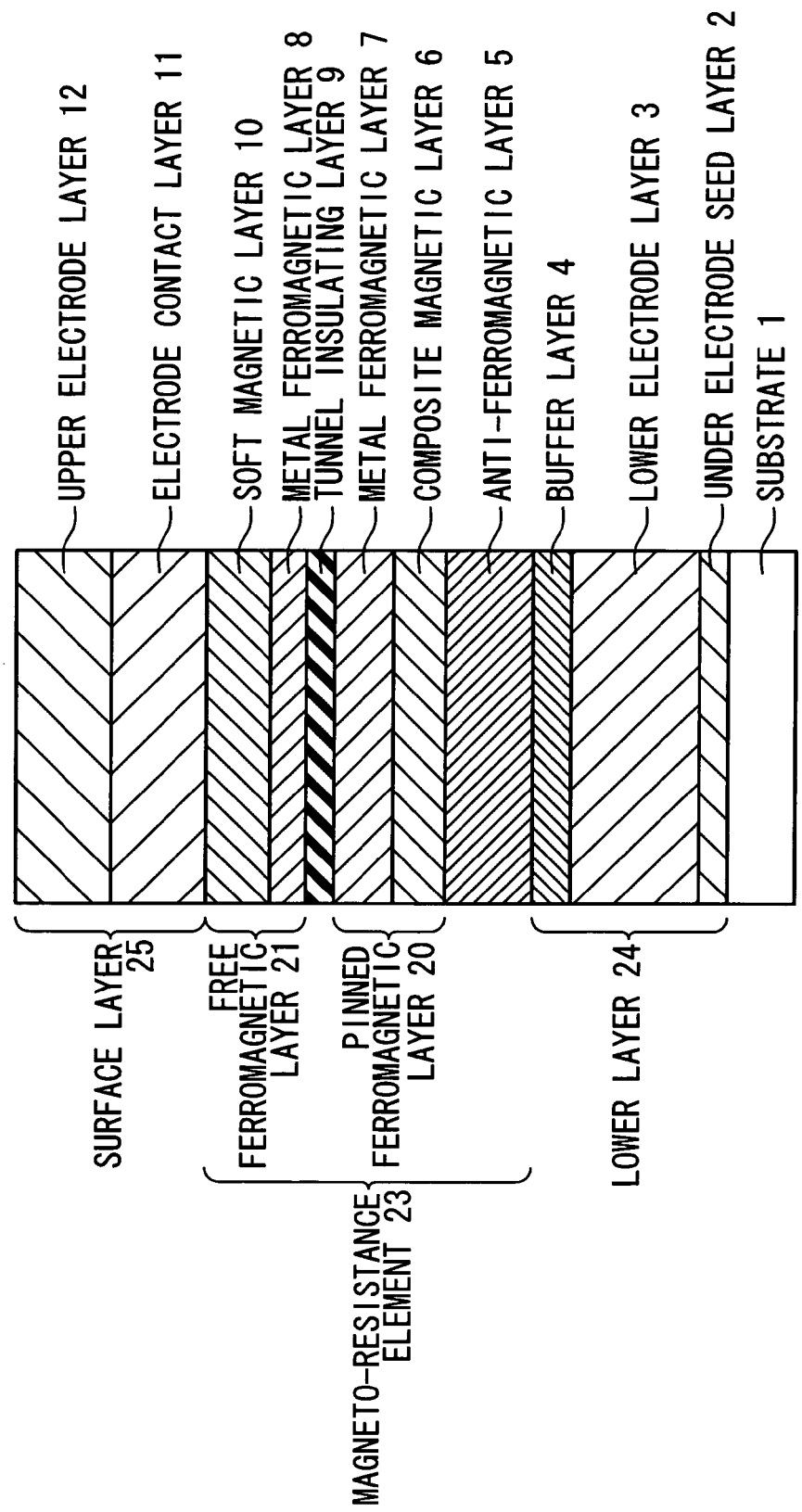
FIG. 2 is a sectional view showing a structure of a magneto-resistance device according to a first embodiment of the present invention.

First, a configuration of the magneto-resistance device according to the first embodiment of the present invention will be described. FIG. 2 is a cross-sectional view showing a configuration of the magneto-resistance device according to the first embodiment of the present invention. Referring to FIG. 2, the magneto-resistance device in the first embodiment includes a magneto-resistance element 23. A lower layer 24 is formed on a substrate 1 as a wiring layer. The magneto-resistance element 23 is formed on the lower layer 24. A surface layer 25 is formed on the magneto-resistance element 23. The magneto-resistance device in the first embodiment is applicable to a memory cell of MRAM of a cross-point cell type.

The lower layer 24 includes a lower electrode seed layer 2, a lower electrode layer 3, and a buffer layer 4, which are formed on the substrate 1 in this order. The lower layer 24 connects the magneto-resistance element 23 with the lower electrode layer 3 electrically. The lower electrode seed layer 2 controls the orientations of the lower electrode layer 3 and the buffer layer 4. The lower electrode seed layer 2 is typically formed of Ta and Cr. The lower electrode layer 3 is a wiring layer for the magneto-resistance element 23. The lower electrode layer 3 is typically formed of $Al_{90}Cu_{10}$. The buffer layer 4 controls the orientation of an anti-ferromagnetic layer 5 provided on the buffer layer 4 to stabilize the anti-ferromagnetic phase of the anti-ferromagnetic layer 5. The buffer layer 4 is typically formed of NiFe and CoFe.

The surface layer 25 includes an electrode contact layer 11 and an upper electrode layer 12, which are formed sequentially on the magneto-resistance element 23. The surface layer 25 contacts the magneto-resistance element 23 with the upper electrode layer 12 electrically. The electrode contact layer 11 is typically formed of TiN, Ta, Ru, W, Zr, and Mo. The upper electrode layer 12 is a wiring layer for the magneto-resistance element 23. The upper electrode layer 12 is typically formed of $Al_{90}Cu_{10}$.

The magneto-resistance element 23, functioning as a memory cell of the MRAM, includes the anti-ferromagnetic layer 5, a pinned ferromagnetic layer 20, a tunnel insulating layer 9, and a free ferromagnetic layer 21. A magnetic tunnel junction is configured of the pinned ferromagnetic layer 20, the tunnel insulating layer 9, and the free ferromagnetic layer 21. The anti-ferromagnetic layer 5 is provided on the lower layer 24, and formed of an anti-ferromagnetic material containing Mn (Mn-based alloy), and typically, formed of PtMn and IrMn. The anti-ferromagnetic layer 5 imposes an exchange interaction to the pinned ferromagnetic layers 20 that are formed directly on the anti-ferromagnetic layer 5, to fix the direction of a spontaneous magnetization of the pinned ferromagnetic layer 20.

The pinned ferromagnetic layer 20 is provided on the anti-ferromagnetic layer 5, and has a fixed spontaneous magnetization. More specifically, the pinned ferromagnetic layer 20 includes a composite magnetic layer 6 and a metal ferromagnetic layer 7 formed on the anti-ferromagnetic layer 5 in this order. The metal ferromagnetic layer 7 is formed of a metal ferromagnetic alloy with a high spin polarization rate, and typically, formed of CoFe. CoFe alloy is a ferromagnetic substance that is relatively hard magnetic (that is, coercive force is large). As described later, the spontaneous magnetization of the pinned ferromagnetic layer 20 is fixed by the exchange interaction from the anti-ferromagnetic layer 5. The composite magnetic layer 6 has a function to prevent at least one of elements forming the anti-ferromagnetic layer 5 (for example, Mn) from diffusing into the tunnel insulating layer 9. The composite magnetic layer 6 is formed of a ferromagnetic material which has been not oxidized and an oxide of the material that is easy to bind with oxygen compared with the ferromagnetic material. The details are described later.

The tunnel insulating layer 9 is provided on the pinned ferromagnetic layer 20, and is formed of a non-magnetic insulator thin to an extent that a tunneling current flows. The tunnel insulating layer 9 is typically formed of AlOx, AlNx, and MgOx. The thickness is set in accordance with a resistance requested to the magneto-resistance element 23, and is typically 1.2 to 2 nm. The resistance of the tunnel insulating layer 9 in the direction of the thickness is different in accordance with whether the spontaneous magnetizations of the pinned ferromagnetic layer 20 and the free ferromagnetic layer 21 are parallel or anti-parallel, because of an effect of tunneling magneto-resistance (TMR effect). The data stored in the magneto-resistance element 23 can be determined based on the resistance value in the direction of the thickness of the tunnel insulating layer 9.

The free ferromagnetic layer 21 is provided on the tunnel insulating layer 9, and the direction of the spontaneous magnetization is invertible. Moreover, the free ferromagnetic layer 21 is formed so that the direction of the spontaneous magnetization directs in parallel or anti-parallel to the spontaneous magnetization of the pinned ferromagnetic layer 20. The magneto-resistance element 23 stores a data of one bit as the direction of the spontaneous magnetization of the free ferromagnetic layer 21. The free ferromagnetic layer 21 includes a metal ferromagnetic layer 8 and a soft magnetic layer 10. The metal ferromagnetic layer 8 is formed of a metal ferromagnetic alloy with a high spin polarization rate, and typically formed of ferromagnetic substance containing Co such as Co and CoFe. The CoFe alloy is relatively hard magnetic ferromagnetic substance. The soft magnetic layer 10 is formed of a ferromagnetic substance containing Ni, and typically formed of a ferromagnetic substance (Ni alloy) containing Ni such as NiFe that is a soft magnetic material and has a small magnetization. In general, the ferromagnetic substance containing Ni is relatively soft magnetic (that is, coercive force is small). Such a structure of the free ferromagnetic layer 21 makes the reverse of the spontaneous magnetization in the free ferromagnetic layer facilitate while increasing the magneto-resistance change ratio (MR ratio) in the magnetic tunnel junction.

Next, the composite magnetic layer 6 will be further described. As described above, the diffusion of Mn contained in the anti-ferromagnetic layer 5 into the tunnel insulating layer 9 is not preferable because the MR ratio of the magnetic tunnel junction is deteriorated. In order to prevent Mn contained in the anti-ferromagnetic layer 5 from diffusing into the tunnel insulating layer 9, the pinned ferromagnetic layer 20 is preferably formed from the composite magnetic layer 6 and the metal ferromagnetic layer 7 as shown in FIG. 21.

The composite magnetic layer 6 is formed on the anti-ferromagnetic layer 5, and prevents Mn of the anti-ferromagnetic layer 5 from diffusing into the tunnel insulating layer 9 as described later. The metal ferromagnetic layer 7 is provided on the composite magnetic layer 6. At this time, the metal ferromagnetic layer 7 has a high spin polarization rate, and is preferably formed of the metal ferromagnetic alloy including Co as a main component, which has thermal stability and is hard to diffuse easily. The metal ferromagnetic layer 7 becomes hard in magnetism by forming the metal ferromagnetic layer 7 of the metal ferromagnetic alloy including Co as the main component. Moreover, because the metal ferromagnetic layer 7 has no Ni (or a little), there is no possibility for Ni to be diffused. Here, the phrase "including Co as the main component" means that it is Co that the atomic percent is the highest in elements of the metal ferromagnetic alloy.

This structure has advantages that it is possible to reduce the film thickness of the pinned ferromagnetic layer 20 and reduce the number of layers of the magneto-resistance element. Moreover, the high MR ratio can be attained by using the metal ferromagnetic layer 7 for an interface with the tunnel insulating layer 9 (a tunnel barrier layer).

Figure 3:
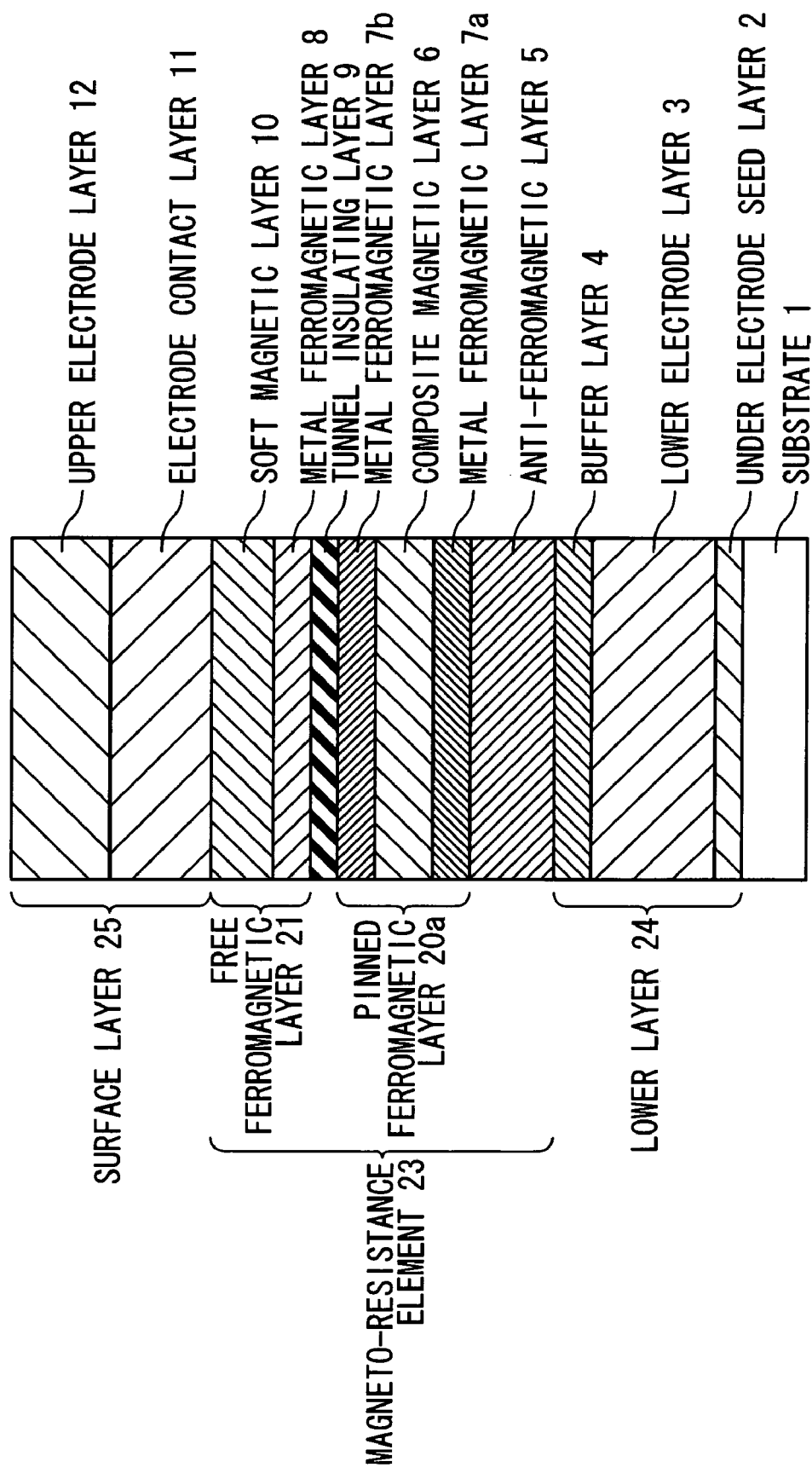
FIG. 3 is a sectional view showing the structure of the magneto-resistance device according to a second embodiment of the present invention.

FIG. 3 is a cross-section view showing a configuration of the magneto-resistance device according to the second embodiment of the present invention. In the second embodiment, the pinned ferromagnetic layer 20 has a configuration in which the composite magnetic layer 6 is inserted in the metal ferromagnetic layer 7. That is to say, the pinned ferromagnetic layer 20 has a three-layered structure in which the composite magnetic layer 6 is sandwiched by a metal ferromagnetic layer 7a and a metal ferromagnetic layer 7b. In this case, the same effect as the above-mentioned effect can be achieved.

The composite magnetic layer 6 has electrical conductivity like metal. It is desirable that the resistivity is small to an extent that it can be completely negligible compared with the tunneling magneto-resistance even if the thickness of the composite magnetic layer 6 is thickened to a considerable extent. The value of resistivity is preferably in a range from 10 μΩcm to 3000 μΩcm.

The composite magnetic layer 6 is a composite thin film, which contains metal ferromagnetic substance, which has been not oxidized, as a main component, and oxide of non-magnetic element, easy to bind with oxygen compared with the above-mentioned metal ferromagnetic substance, as a sub component. The composite magnetic layer 6 can prevent Mn from diffusing while maintaining the electrical conductivity like metal and ferromagnetism. CoFe is typically exemplified as the metal ferromagnetic substance of the composite magnetic layer 6. As oxides, $TaO_x$, $HfO_x$, $NbO_x$, $ZrO_x$, $CeO_x$, $AlO_x$, $MgO_x$, $SiO_x$, and $TiO_x$ are exemplified. These non-magnetic elements have a lower oxide generation free energy and are easy to be oxidized, compared with the ferromagnetic elements Fe, Co, and Ni. As a ferromagnetic materials used for the composite magnetic layer 6, it is preferable to use Co or the metal ferromagnetic alloy containing Co as the main component. Co or the metal ferromagnetic alloy containing Co as the main component have a high spin polarization rate, and are hard to be oxidized. Also, they are hard to be diffused due to thermal stability.

It is important for the composite magnetic layer 6 to contain the metal ferromagnetic substance, which has been not oxidized, as the main component in that the composite magnetic layer 6 shows the electrical conductivity and the ferromagnetism. A S/N (Signal-to-Noise) ratio is improved in a reading operation since the composite magnetic layer 6 has a metal electrical conductivity. An exchange interaction of the anti-ferromagnetic layer 5 can act to the metal ferromagnetic layer 7 due to the composite magnetic layer 6 having the ferromagnetism, so that both of the composite magnetic layer 6 and the metal ferromagnetic layer 7 are made possible to function as the pinned ferromagnetic layer 20. To prevent the metal ferromagnetic substance of the composite magnetic layer 6 from being oxidized, the oxide of non-magnetic element is used, which is easily oxidized compared with the metal ferromagnetic substance, as the oxide of the composite magnetic layer 6.

Figure 4:
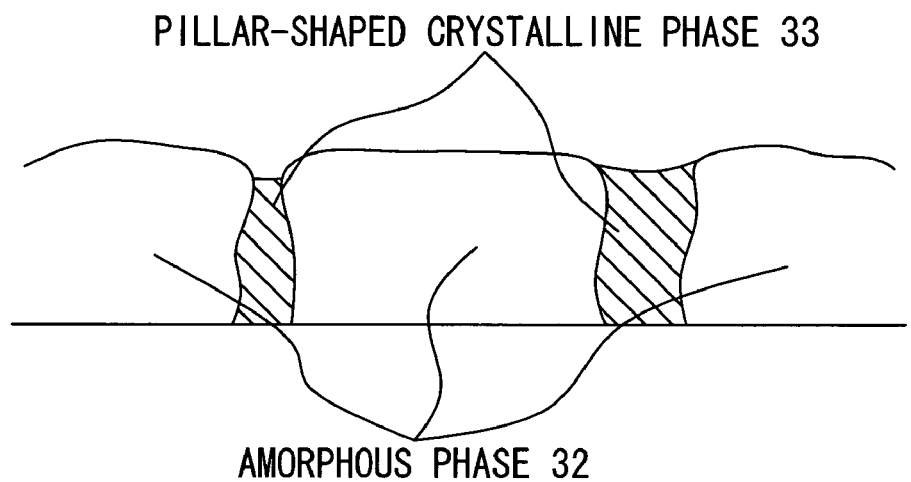
FIG. 4 is a sectional view showing a first example of a composite magnetic layer.
Figure 5:
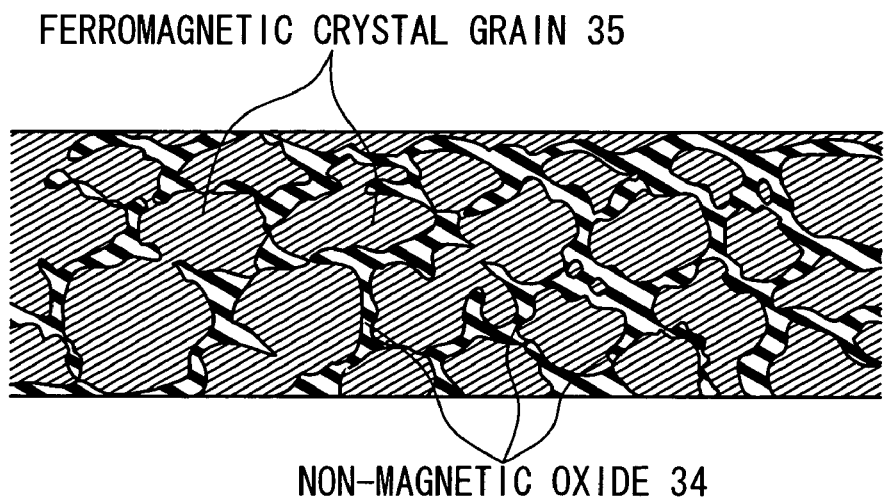
FIG. 5 is a sectional view showing a second example of the composite magnetic layer.
Figure 6:
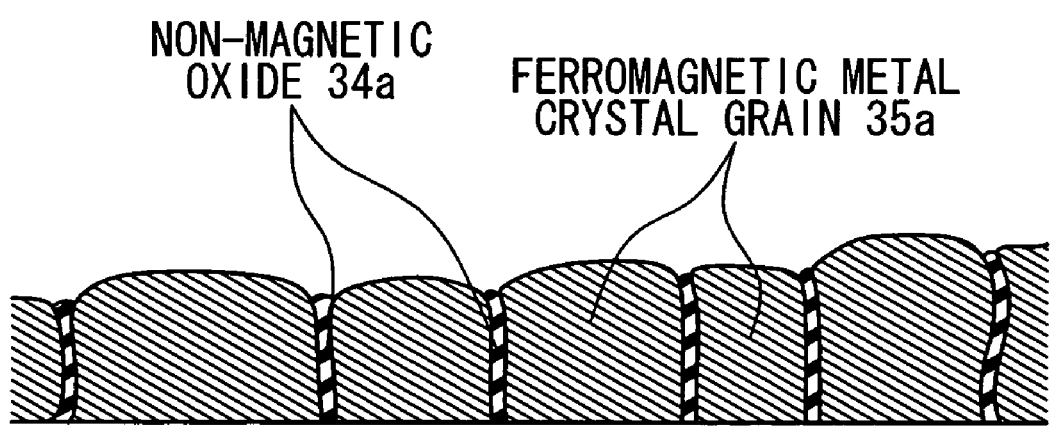
FIG. 6 is a sectional view showing a third example of the composite magnetic layer.

The composite magnetic layer 6 has any of structures shown in FIG. 4 to FIG. 6 in accordance with component materials and a manufacturing method, e.g., the composition ratio of non-magnetic element and the metal ferromagnetic element, and the atomic radius of the non-magnetic element of the oxide. FIG. 4 is a cross section view of the composite magnetic layer 6 in a first example. When the oxide of the material having a larger atomic radius than that of the metal ferromagnetic substance is contained in the metal ferromagnetic substance in a high density, the structure of the composite magnetic layer 6 has a structure in which the whole of structure is configured of an amorphous phase or a structure is configured of the amorphous phase and a pillar-shaped crystalline phase (crystalline area). FIG. 4 shows the structure containing an amorphous phase 32 and a pillar-shaped crystalline phase 33. The reason why the composite magnetic layer 6 takes such a structure is that the crystallization of the metal ferromagnetic substance is obstructed by the non-magnetic element with a large atomic radius.

The pillar-shaped crystalline phase 33 exists as a plurality of pillar-shaped crystalline areas in the amorphous phase 32 or an amorphous film. The pillar-shaped crystalline phase 33 passes through the composite magnetic layer 6 in the direction of the thickness. The pillar-shaped crystalline phases 33 are mutually separated by the amorphous phase 32. A ferromagnetic metal cluster occupies in a major portion of the amorphous phase 32, and a non-magnetic oxide cluster is contained at random in some portions. Mn is captured by the non-magnetic oxide cluster, which exists at random in the composite magnetic layer 6, and the magnetic coupling and the electrical conductivity are secured by the ferromagnetic metal occupying in the major portion of the composite magnetic layer 6.

A composition of the amorphous phase 32 in the composite magnetic layer 6 has a composition formula of $D_zM_{1-z}O_x$. Here, "D" is at least one of Co, Fe, and Ni. M is at least one of Ta, Hf, Zr, Nb, and Ce. Z satisfies the rage of $0.6 \leq Z \leq 0.9$ (X>0) as the composition ratio. Also, segregation of the ferromagnetic metal occurs in a region of the pillar-shaped crystalline phase 33, and this region contributes to improve the magnetic coupling and the electric coupling with upper and lower layers. For instance, when CoFe is used as the metal ferromagnetic substance, and any of $TaO_x$, $HfO_x$, $ZrO_x$, $NbO_x$, and $CeO_x$ is used as the oxide of the composite magnetic layer 6, the composite magnetic layer 6 has the structure as shown in FIG. 4.

FIG. 5 is a cross sectional view of the composite magnetic layer 6 in a second example. If the atomic radius of the non-magnetic element of the oxide is smaller than that of the element of the metal ferromagnetic substance, the composite magnetic layer 6 has a structure that there are a plurality of ferromagnetic metal crystal grains 35 as grainy crystals of the metal ferromagnetic substance, and non-magnetic oxides 34 precipitated in the grain boundaries of the ferromagnetic metal crystal grains 35. The material having such a structure is sometimes called as a granular alloy. In this case, some crystal grain of the plurality of ferromagnetic metal crystal grains 35 is not completely isolated, and is contact with adjacent one or more crystal grains of the other the ferromagnetic metal crystal grains 35 directly or through a pinhole and the like of the non-magnetic oxide 34. In this structure, the ferromagnetic metal crystal grains 35 are magnetically coupled. Therefore, the composite magnetic layer 6 shows a soft ferromagnetism and a metal electrical conductivity. Also, in this structure, if the ferromagnetic material is at least one selected from the group consisting of Co, Fe, and Ni, the non-magnetic material is exemplified by Al, Si, Mg, and Ti. For instance, when CoFe is used as the metal ferromagnetic substance of the composite magnetic layer 6, and any of $AlO_x$, $SiO_x$, $MgO_x$, and $TiO_x$ is used as the oxide in the composite magnetic layer 6, the composite magnetic layer 6 has the structure as shown in FIG. 5.

FIG. 6 is a cross sectional view of the composite magnetic layer 6 in a third example. This composite magnetic layer 6 has the structure in which there are a plurality of pillar-shaped ferromagnetic metal crystal grains 35a as crystal grains of the metal ferromagnetic substance, and non-magnetic oxides 34a of non-crystal precipitated in the grain boundaries between the ferromagnetic metal crystal grains 35a. In this case, the plurality of ferromagnetic metal crystal grains 35a pass through the composite magnetic layer 6 in the direction of the thickness. That is, any of the plurality of ferromagnetic metal crystal grains 35a is not separated by the non-magnetic oxide 34a in the direction perpendicular to the film surface of the composite magnetic layer 6.

Such a structure can be attained when the non-magnetic material is mixed in the ferromagnetic material in a low density or when the thickness of the composite magnetic layer 6 is thinner than a thickness corresponding to the size of the ferromagnetic metal crystal grain 35 in the composite magnetic layer 6 in case of the second example. The non-magnetic oxide 34a is an oxide of the element selected from among Al, Si, Mg, Ti, Ta, Hf, Zr, Nb, and Ce. In this case, the non-magnetic oxide 34a segregates in the crystal grain boundary of the ferromagnetic metal crystal grain 35a. The ferromagnetic metal crystal grain 35a is not separated in the direction perpendicular to the film surface of the composite magnetic layer 6. However, the diffusion through the crystal grain boundaries (the non-magnetic oxide 34a) contributes largely to the Mn diffusion. Therefore, the effect of prevention of the Mn diffusion by the composite magnetic layer 6 can be obtained enough. In this case, a part of the plurality of ferromagnetic metal crystal grains 35a is not completely isolated, and is contact with adjacent one or more of the ferromagnetic metal crystal grains 35a directly or through a pinhole and the like of the non-magnetic oxide 34a.

In common to the second and third examples of the composite magnetic layer, it is preferable that the thickness of the non-magnetic oxide 34 or 34a is thinner than the particle diameter of the ferromagnetic metal crystal grain 35 or 35a and is equal to or less than 2 nm, so that the electric and magnetic coupling of the ferromagnetic metal crystal grains 35 and 35a can be kept. In this case, the average diameter of the plurality of ferromagnetic metal crystal grains 35 or 35a is preferably equal to or less than 10 nm. Moreover, the particle size is preferably equal or less than 3 nm so that the ferromagnetic metal crystal grain 35 or 35a is not electrically and magnetically isolated completely. The thickness of the ferromagnetic metal crystal grain 35 or 35a, and the size of the non-magnetic oxides 34 or 34a can be controlled in accordance with a ratio of the non-magnetic material mixed in the ferromagnetic material used for the composite magnetic layer 6, or in accordance with a film forming condition of the composite magnetic layer 6 (a flow rate of gas such as oxygen to be doped in the film formation). The plurality of crystal grains in the composite magnetic layer in the present invention keep the ferromagnetic coupling.

In any structures shown in FIG. 4 to FIG. 6, the composite magnetic layer 6 has a structure in which the diffusion can be prevented by scrupulosity of the non-magnetic oxide contained in the composite magnetic layer 6. In addition, the composite magnetic layer 6 containing the oxide operates to trap Mn that is easy to be bounded with oxygen. When Mn is diffused into the composite magnetic layer 6 containing the oxide, the diffused Mn is bounded with oxygen and stabilized, and fixed in the composite magnetic layer 6. In addition, the composite magnetic layer 6 hardly has a crystal grain boundary of a normal metal ferromagnetic layer, or the crystal grain boundary, which is the high-rate diffusion path, is occupied by the oxide and is decreased. Therefore, the diffusion prevention ability is high. Due to these effects, the composite magnetic layer 6 can prevent the diffusion of Mn into the tunnel insulating layer 9 effectively without separating electrically and magnetically coupling in the pinned ferromagnetic layer 20. Such a property cannot be shown in the conventional oxide diffusion preventing layer.

Figure 12:
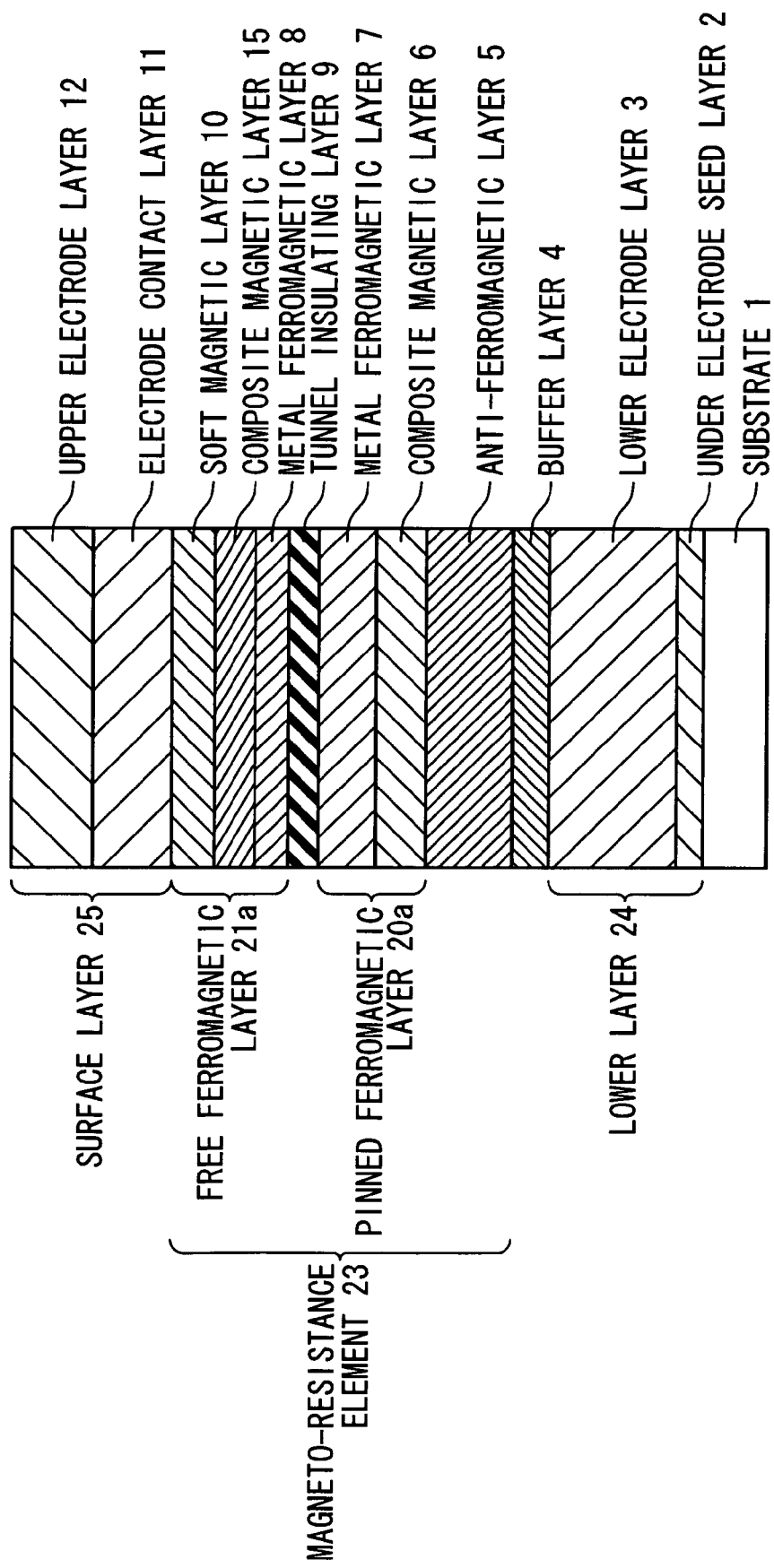
FIG. 12 is a sectional view showing the structure of the magneto-resistance device according to a third embodiment of the present invention.

FIG. 12 shows a configuration of the magneto-resistance device according to the third embodiment of the present invention. Referring to FIG. 12, the magneto-resistance device in the third embodiment is different from that of the first embodiment shown in FIG. 2 in that the magneto-resistance device in the third embodiment has no composite magnetic layer 6, and a composite magnetic layer 15 is provided between the metal ferromagnetic layer 8 and the tunnel insulating layer 9 as a part of the free ferromagnetic layer 21a. The other components are the same as those of the device shown in FIG. 2. In the magneto-resistance device in the third embodiment, the diffusion of Ni that is used in the free ferromagnetic layer 21 can be prevented by inserting the composite magnetic layer 15 having the same structure as the composite magnetic layer 6 in the free ferromagnetic layer 21.

In this case, the composite magnetic layer 15 has the same configuration as the composite magnetic layer 6. Like the composite magnetic film 6, the diffusion of Ni can be prevented by the diffusion prevention function of the composite magnetic layer 15. That is, the structure shown in FIG. 12 is preferable in the point that the diffusion of Ni into the tunnel insulating layer 9 can be prevented while the MR ratio is increased.

As described above, in the magneto-resistance element 23 of the present invention, the composite magnetic layer 6 and the composite magnetic layer 15 are respectively inserted in the pinned ferromagnetic layer 20 and the free ferromagnetic layer 21 as diffusion preventing layers. Therefore, a problem of the increase of saturation magnetization may be caused by inserting the composite magnetic layer 6 and the composite magnetic layer 15. To solve this, the configurations shown in FIG. 13 and FIG. 14 should be applied.

Figure 13:
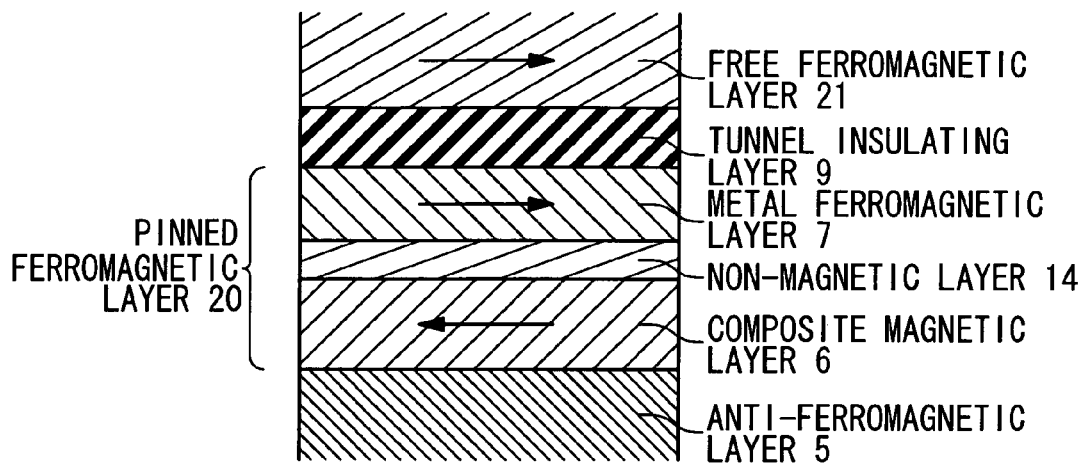
FIG. 13 is a sectional view showing the structure of the magneto-resistance device according to a fourth embodiment of the present invention.
Figure 14:
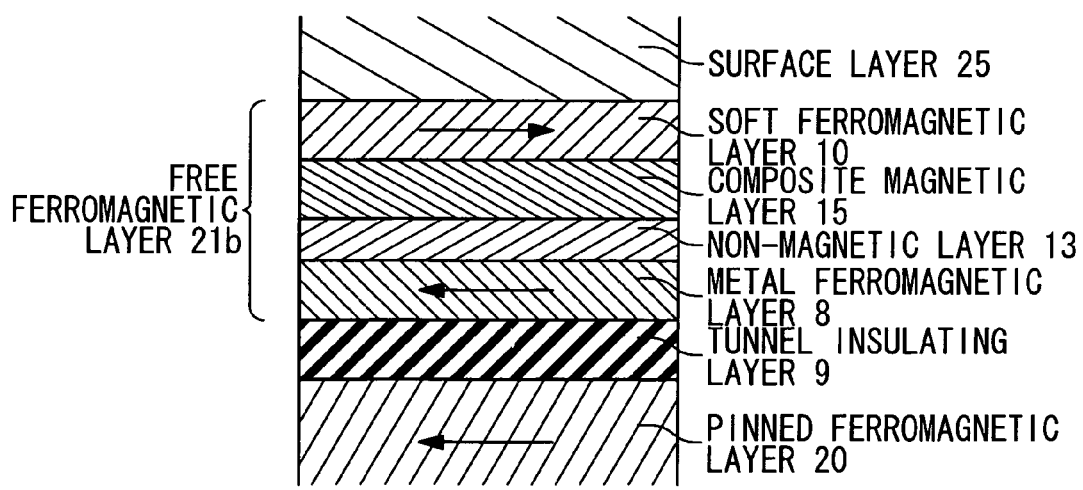
FIG. 14 is a sectional view showing the structure of the magneto-resistance device according to a fifth embodiment of the present invention.

FIG. 13 shows a configuration of the magneto-resistance device according to the fourth embodiment of the present invention. In the pinned ferromagnetic layer 20, as shown in FIG. 13, a metal ferromagnetic layer 7 is provided in the pinned ferromagnetic layer 20 containing a composite magnetic layer 6 to anti-ferromagnetically couple through the non-magnetic layer 14. FIG. 14 shows a configuration of the magneto-resistance device according to the fifth embodiment of the present invention. As shown in FIG. 14, a metal ferromagnetic layer 8 is provided in the free ferromagnetic layer 21b containing the composite magnetic layer 15 to anti-ferromagnetically couple through the non-magnetic layer 13.

The non-magnetic layers 14 and 13 are formed of material such that the composite magnetic layer 6 and the metal ferromagnetic layer 7, or the composite magnetic layer 15 and the metal ferromagnetic layer 8 are anti-ferromagnetically coupled strongly. That is, the non-magnetic layers 14 and 13 are typically formed of any of Cu, Cr, Rh, Ru, and $RuO_x$. The pinned ferromagnetic layer 20 is formed from two ferromagnetic layers (the composite magnetic layer 6 and the metal ferromagnetic layer 7) and the non-magnetic layer 14, which is sandwiched by the two ferromagnetic layers and is anti-ferromagnetically coupled with the two ferromagnetic layers, so that a substantial magnetization of the pinned ferromagnetic layer 20 can be reduced. Moreover, the free ferromagnetic layer 21 is configured of two ferromagnetic layers (the composite magnetic layer 15 and the metal ferromagnetic layer 8) and the non-magnetic layer 13, which is sandwiched by the two ferromagnetic layers and anti-ferromagnetically coupled with he two ferromagnetic layers. Thus, the non-magnetic layer 14 functions to reduce a substantial magnetization or demagnetization field in the free ferromagnetic layer 21. A reverse magnetic field of the free ferromagnetic layer 21 (coercive force) is decreased through the reduction of the demagnetization field. Therefore, the structure shown in FIG. 14 contributes to increase the MR ratio and can prevent Ni from diffusing into the tunnel insulating layer 9. In addition, the free ferromagnetic layer 21 can be made softer.

In the structure shown in FIG. 14, when the free ferromagnetic layer 21 soft enough is obtained, the structure having no soft ferromagnetic layer 10 is made applicable. By excluding the soft ferromagnetic layer 10, Ni is excluded from the free ferromagnetic layer 21, and an adverse effect due to the diffusion of Ni can be fundamentally avoided.

Next, a manufacturing method of the magneto-resistance element of the present invention will be described. A TMR element of the magneto-resistance device shown in FIG. 2 is formed by using high vacuum spattering apparatus. Here, an argon pressure in the sputtering discharge is set to an optimum value in a range of 5 to 10 mTorr, and a target voltage is set to an optimum value in a range of 300 to 500 V, based on a film to be formed.

First, a Si single crystal substrate having a surface oxide film is prepared as a substrate 1. A Ta layer is formed to have the film thickness of 3 nm as a lower electrode seed layer 2. Subsequently, A Cu layer having the film thickness of 50 nm is formed on the lower electrode seed layer 2 as a lower electrode layer 3. Then, a Ta layer having the film thickness of 15 nm is formed on the lower electrode 3 as a buffer layer 4. Further, $Co_{90}Fe_{10}$ having the film thickness of 3 nm is formed. These films have a function to promote orientation to the anti-ferromagnetic phase of the anti-ferromagnetic layer 5 to be formed thereon, and are formed depending on a coupling with the anti-ferromagnetic layer 5.

Next, a $Pt_{49}Mn_{51}$ film having the film thickness of 30 nm is formed on the buffer layer 4 as an anti-ferromagnetic layer 5. NiMn and IrMn layers may be used, which have high thermal stability, as other anti-ferromagnetic layers 5. Then, a composite magnetic layer 6 having the film thickness of 4 nm is formed on the anti-ferromagnetic layer 5 as a Mn diffusion preventing layer 6. Details of the method of forming the composite magnetic layer 6 will be described later. Next, a $Co_{90}Fe_{10}$ film having the film thickness of 5 nm is formed as a metal ferromagnetic layer 7. Subsequently, an Al layer having the film thickness of 2 nm is formed on the metal ferromagnetic layer 7 as a tunnel insulating layer 9. Then, a plasma oxidation (a high frequency plasma oxidation method) is carried out in an oxygen atmosphere to form an $AlO_x$ layer. It should be noted that the tunnel insulating layer 9 may be formed from an $AlN_x$ layer or a $MgO_x$ layer.

Next, a $Co_{90}Fe_{10}$ film having the film thickness of 2.5 nm is formed on the tunnel insulating layer 9 as the metal ferromagnetic layer 8. Subsequently, a NiFe film having the film thickness of 7.5 nm is formed as a soft magnetic layer 10. Subsequently, a Ta layer having the film thickness of 30 nm is formed on the soft magnetic layer 10 as an electrode contact layer 11. Thereafter, a sample is taken out from a chamber, and a photo lithography, an etching, and a deposition of the interlayer insulation film are carried out to form connection patterns or contact holes. Then, the sample is carried in an upper electrode film forming apparatus. After the surface of the contact is cleaned in a vacuumed state through the Ar etching, a Cu layer is formed to have the film thickness of 300 nm. Finally. The sample is taken out from the chamber, and the pattern of an upper electrode 12 is formed through the photo lithography and the etching.

The TMR element as the magneto-resistance device is completed through the above-mentioned process.

The composite magnetic layer 6 can be manufactured by a reactive sputtering using a sputtering gas which contains an oxygen gas, as well as the composite magnetic layer 15. A mixed gas of the oxygen gas and the argon gas is typically used as the sputtering gas. As a sputtering target, typically, an alloy is used that is formed of a metal ferromagnetic substance and a non-magnetic element that can be easily oxidized compared with the metal ferromagnetic substance. For example, $(Co_{90}Fe_{10})_{85}Ta_{15}$ alloy target is used. When this alloy target is sputtered by using the sputtering gas which contains the oxygen gas, oxygen is bounded with the non-magnetic metal (Ta) prior to the metal ferromagnetic substance ($Co_{90}Fe_{10}$). By adjusting an amount of the oxygen contained in the sputtering gas appropriately, only the non-magnetic metal is oxidized without oxidizing the metal ferromagnetic substance, and the composite magnetic layer 6 can be formed.

Figure 7:
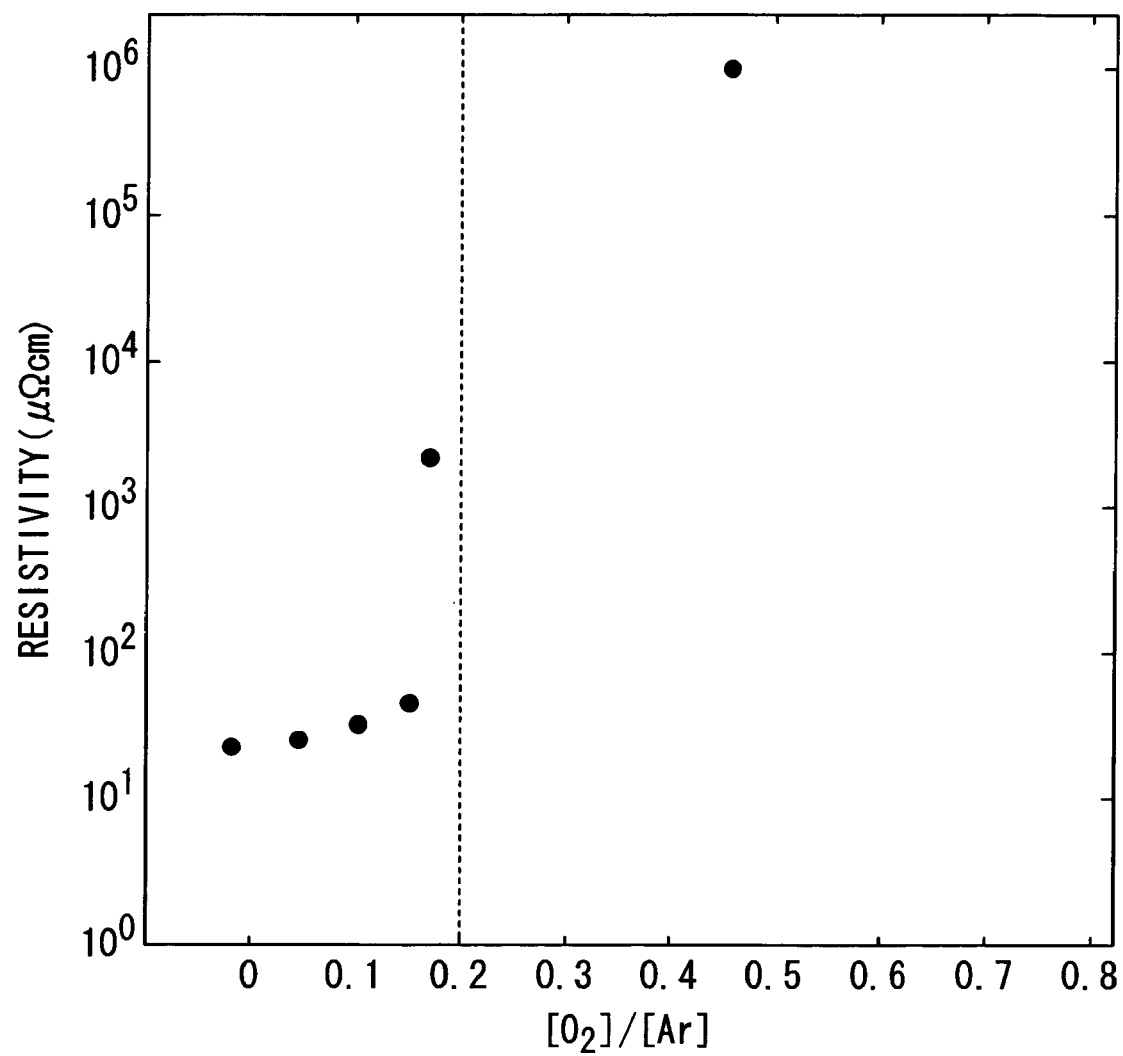
FIG. 7 is a graph showing resistivity of a thin film.
Figure 8:
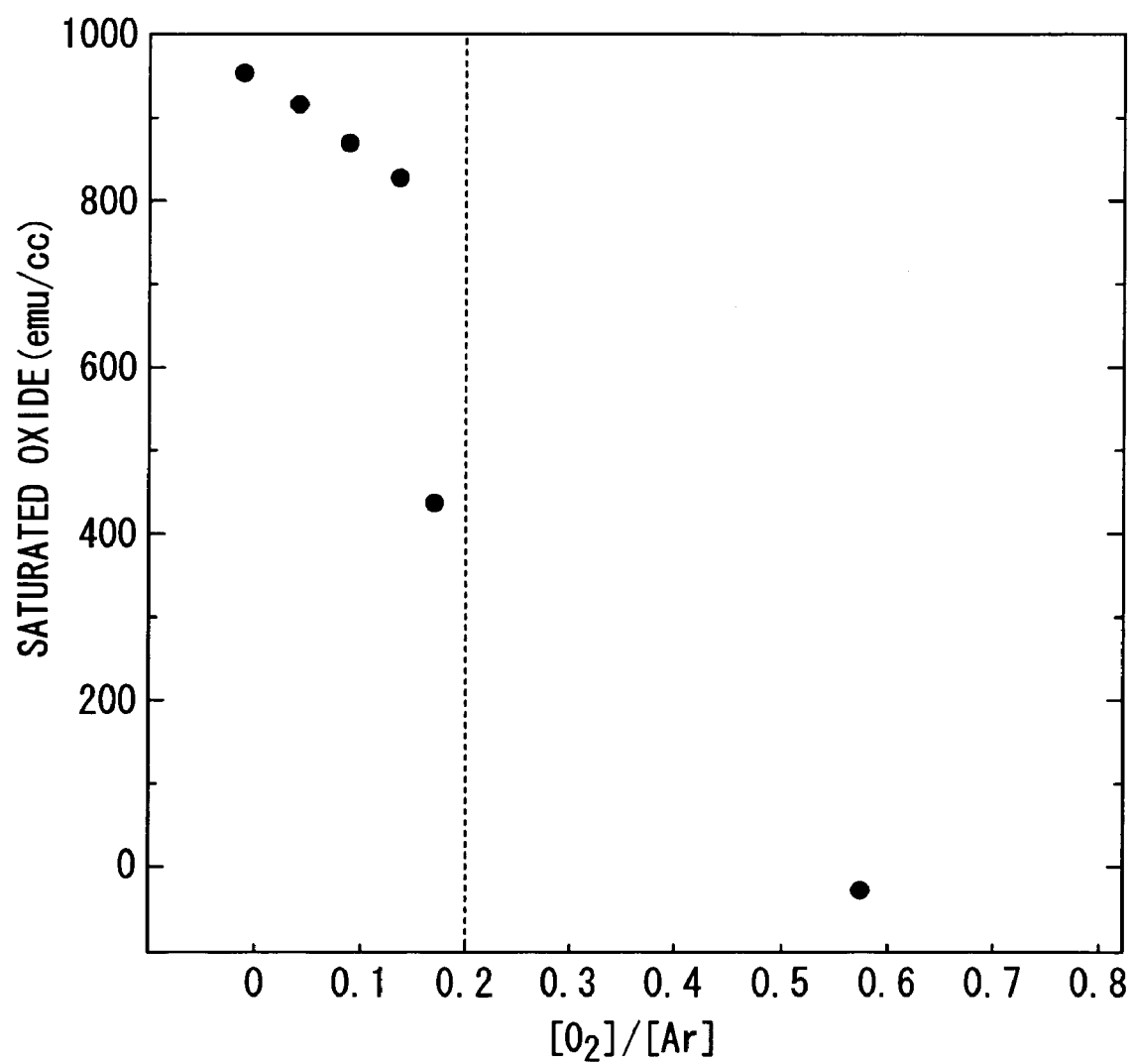
FIG. 8 is a graph showing saturation magnetization of the film shown with FIG. 7.

FIG. 7 is a graph showing resistivity of a thin film (vertical axis) that is formed by sputtering the $(Co_{90}Fe_{10})_{85}Ta_{15}$ alloy target, which is formed of CoFe as the ferromagnetic substance and Ta as the non-magnetic element, using the sputtering gas containing the oxygen gas. FIG. 8 is a graph showing a saturation magnetization of the formed thin film (vertical axis). The horizontal axes in these graphs indicate a ratio of a flow rate the oxygen gas (sccm) to a flow rate of the argon gas (sccm), which are introduced into the chamber in which the sputtering is carried out (hereafter, to be referred to as a "oxygen/argon flow rate ratio"). A main portion of the formed thin film was an oxide amorphous layer having the composition of $(CoFe)_yTa_{1-y}O_x$, and the CoFe pillar-shaped crystal grains are formed partially in the formed thin film. That is, the structure of the thin film is such as shown in FIG. 4. As shown in FIGS. 7 and 8, when the oxygen/argon flow rate ratio is small, the thin film shows a metal electrical conductivity and a saturation magnetization is large. When the oxygen/argon flow rate ratio exceeds 0.2, the resistivity of the thin film increases rapidly, and the saturation magnetization decreases rapidly.

These graphs show that it is necessary that the oxygen/argon flow rate ratio is less than 0.2 in order that CoFe contained in the thin film exists in a metal state. This inference has been proven by the analysis using XPS (X-ray Photoelectron Spectroscopy).

Figure 9:
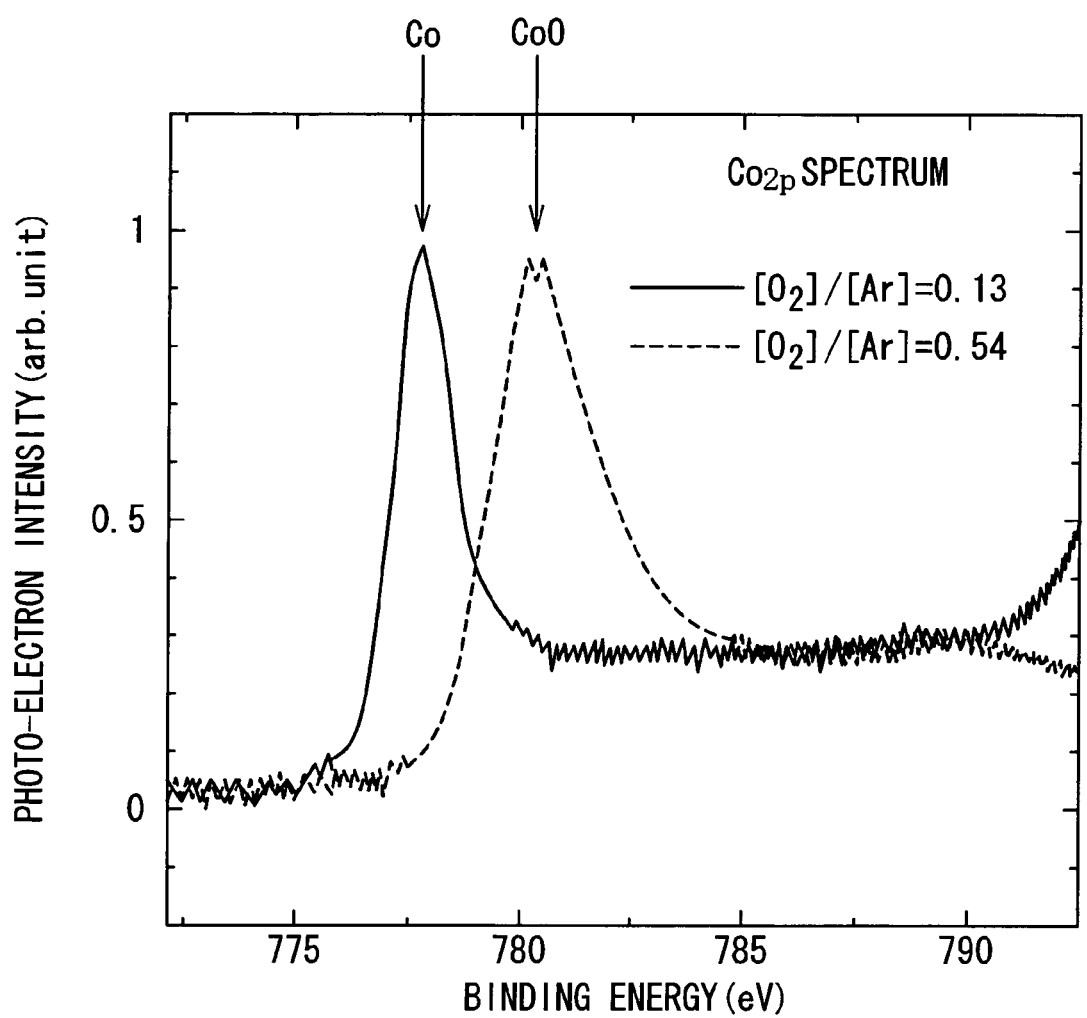
FIG. 9 is data showing $Co_{2p}$ spectra of films by XPS.

FIG. 9 indicates $Co_{2p}$ spectra obtained by carrying out XPS analysis on the thin films formed under the condition of the oxygen/argon flow rate ratios of 0.13 and 0.54. In the $Co_{2p}$ spectra in FIG. 9, 70 percent or more Co is in a metal state in the thin film when the oxygen/argon flow rate ratio is 0.13, and Co contained in the thin film is oxidized when the oxygen/argon flow rate ratio is 0.54.

The above-mentioned phenomena will be described as follows. Oxygen in the reactive sputtering is easy to be bounded with Ta, compared with $Co_{90}Fe_{10}$, and as a result, Ta is selectively oxidized first. When the oxygen/argon flow rate ratio is increased, Ta is oxidized completely and becomes $Ta_2O_5$ in the oxygen/argon flow rate ratio of approximately 0.2. Then, the oxidation of $Co_{90}Fe_{10}$ is started. $(Co_{90}Fe_{10})$—$O_x$, which is obtained by oxidizing $Co_{90}Fe_{10}$, is an anti-ferromagnetic insulator. Therefore, the magnetization decreases, and the resistance increases rapidly. Thus, CoFe loses the electrical conductivity and the ferromagnetism if it is not in metal state. For this reason, the oxygen/argon flow rate ratio in the reactive sputtering should be equal to or less than 0.2. Moreover, as understood from FIG. 7, the resistivity of the composite magnetic layer at that time is in a range of 10 to 3000 μΩcm. In other word, if it is below 3000 μΩcm, the electrical conductivity and the ferromagnetism enough to the magneto-resistance element can be obtained. That is to say, when CoFe is used as the metal ferromagnetic substance, and any one of $TaO_x$, $HfO_x$, NbO$_x$, ZrO$_x$, AlO$_x$, MgO$_x$ and SiO$_x$ is used as the oxide of the non-magnetic metal, the composite magnetic film 6 can be formed of CoFe in the metal state if the oxygen/argon flow rate ratio is less than 0.2.

When the film is formed under the condition that (Co$_{90}$Fe$_{10}$)$_{85}$Ta$_{15}$ alloy target is used, the flow rate of argon is 11.5 sccm, and the flow rate of oxygen is 1.5 sccm (oxygen/argon flow rate ratio=0.13), CoFeTaO$_x$ composite magnetic film 6 of the magneto-resistance device shown in FIG. 2 has such a structure that the amorphous phase occupies in major and a pillar-shaped crystalline phase is partially contained. That is, the CoFeTaO$_x$ composite magnetic film 6 has the structure shown in FIG. 4. This has been confirmed by a transmission type electron microscope. At this time, the composition of the amorphous phase is Co$_{38}$Fe$_{5}$Ta$_{7}$O$_{50}$.

In the composite magnetic layer 6 having such features as in the present invention, the composition ratio of the ferromagnetic material CoFe and the non-magnetic material Ta in the amorphous phase is important. For instance, in case of more Ta, the CoFe cluster in the amorphous phase is isolated in magnetically and electrically. The resistance increases remarkably when it is isolated electrically. When it is isolated magnetically, a magnetic coupling becomes weak with the Co$_{90}$Fe$_{10}$ layer (metal ferromagnetic layer 7) and the Pt$_{49}$Mn$_{51}$ layer (anti-ferromagnetic layer 5) that are formed on up and down sides of the composite magnetic layer 6. Thus, the magnetization of the Co$_{90}$Fe$_{10}$ layer is not fixed. On the other hand, when Ta is few, an enough effect of the diffusion prevention is not achieved.

From the above-mentioned veiwpoints, it is preferable that an appropriate composition ratio of Ta (the non-magnetic oxide material) to CoFe (the ferromagnetic material) in the amorphous phase is in a range from 10% to 40%. Moreover, in order to obtain the composite magnetic layer 6 of the above-mentioned amorphous phase, the atomic radius of the non-magnetic material should be larger than that of the ferromagnetic material, and the thermal stability of the oxide has to be high. Such non-magnetic material is Zr, Hf, Nb, and Ce, besides Ta. The composition ratios of the ferromagnetic material and the non-magnetic material can be controlled based on the composition ratio of the sputtering target, and deposition conditions of the sputtering power and the argon pressure and the like.

In Japanese Laid Open Patent Application (JP-P2002-158381A), it is described that an amorphous phase is used in fixed layers even in the magneto-resistance element. However, in the present invention, the oxide with high thermal stability such as TaO$_x$, ZrO$_x$, NbO$_x$, HfO$_x$, and CeO$_x$ is used as the non-magnetic material in the amorphous, unlike the above Japanese Laid Open Patent Application. That is to say, the amorphous structure is not essentially important for the effect of prevention of the Mn diffusion in the present invention, which will be described below referring to FIG. 10.

Figure 10:
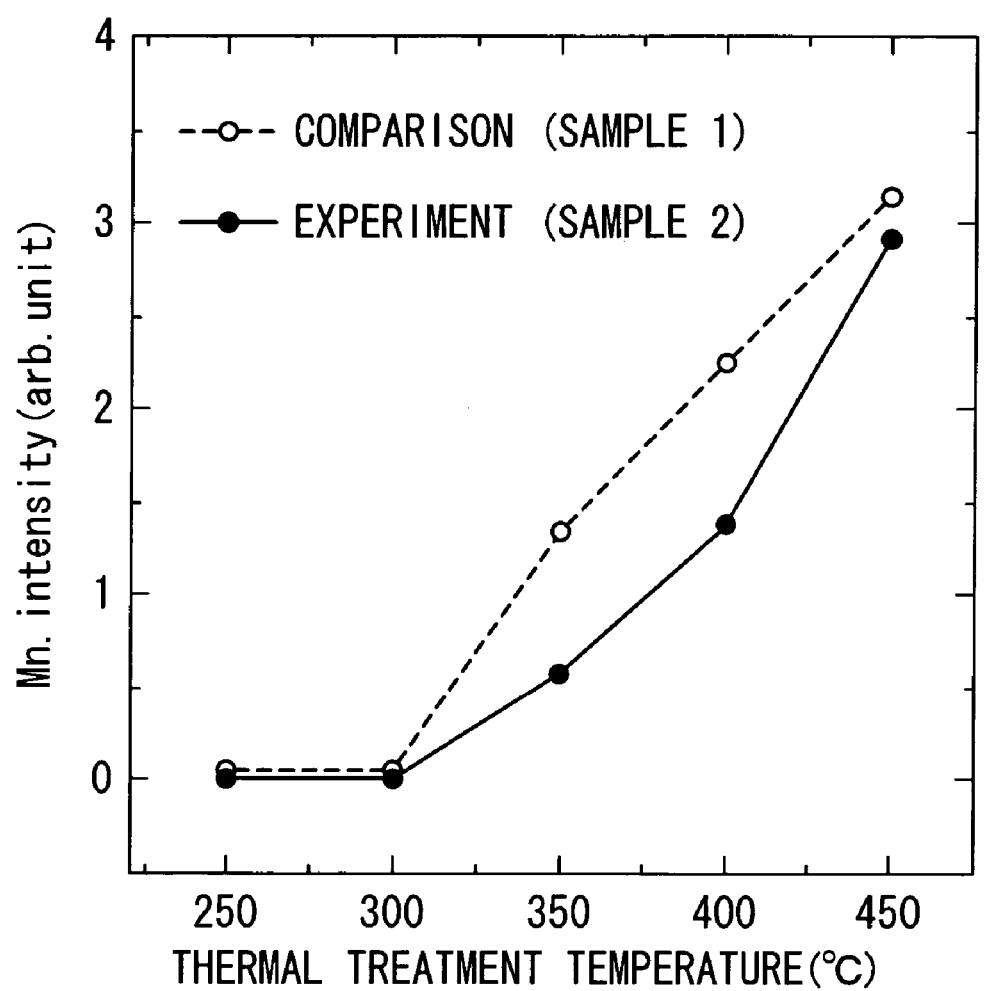
FIG. 10 is graphs showing relation of thermal treatment temperature and a diffusion quantity of Mn.

FIG. 10 is a graph showing a relation between an amount of the Mn diffusion and thermal treatment temperature. The vertical axis is the amount of the diffusion amount of Mn from the anti-ferromagnetic layer 5 to tunnel insulation film 9 (based on photoelectric spectrum). The horizontal axis is the thermal treatment temperatures of samples. FIG. 10 shows measurement data of the amounts of the Mn diffusions in samples 1 and 2. The sample 1 has a structure from the substrate 1 to the tunnel insulation film 9, in which structure a usual amorphous film (Co$_{90}$Fe$_{10}$)$_{85}$Ta$_{15}$ is used in the pinned ferromagnetic layer 20 (shown in the graph as "Comparison example" by a broken line). The sample 2 has a structure from the substrate 1 to the tunnel insulation film 9, in which structure CoFeTaO$_x$ composite magnetic layer 6 of the present invention is used in the pinned ferromagnetic layer 20 (shown in the graph as "Experiment example" by a solid line). The samples have the following structure. As described above, each of the samples has the structure in which substrate/lower electrode seed layer/buffer layer/anti-ferromagnetic layer/usual non-oxidation amorphous film or composite magnetic layer/metal ferromagnetic layer/tunnel insulating layer in order (the lower electrode layer is omitted).

(1) Sample 1 (the Comparison Example as a Conventional Example)
Substrate/Ta (3 nm)/Ni$_{81}$Fe$_{19}$ (3 nm)/Ir$_{20}$Mn$_{80}$ (10 nm)/(Co$_{90}$Fe$_{10}$)$_{85}$Ta$_{15}$ (3 nm)/Co$_{90}$Fe$_{10}$ (3 nm)/Al (1 nm)-O$_x$ (2) Sample 2 (the Experiment Example of the Present Invention)
Substrate/Ta (3 nm)/Ni$_{81}$Fe$_{19}$ (3 nm)/Ir$_{20}$Mn$_{80}$ (10 nm)/CoFeTaO$_x$ (3 nm)/Co$_{90}$Fe$_{10}$ (3 nm)/Al (1 nm)-O$_x$ As shown in FIG. 10, in the composite magnetic layer 6 of the present invention (sample 2), the diffusion amount of Mn is always low, compared with the conventional non-oxidation amorphous film (sample 1). In the thermal treatment at 400° C., the diffusion amount of Mn is suppressed even to 60% (50% or less at 350° C.), compared with the non-oxidation amorphous. This is the effect that Mn is prevented from diffusing in the pinned ferromagnetic layer 20 by the oxide.

The composite magnetic film 6 can be formed by direct sputtering by using the oxide target of CoFeTaO$_x$, in addition to the above-mentioned reactive sputtering method. In that case, to supplement oxygen loss in the sputtering film, the oxygen gas may be mixed in the sputtering atmosphere. In the direct sputtering of the oxide target, it is preferable that the manufacturing throughput and controllability can be improved. The composite magnetic layer CoFeTaO$_x$ layer described above has the structure shown in FIG. 4 that is formed of the amorphous phase 32 and the pillar-shaped crystalline phase 33.

As shown in FIG. 5, the second composite magnetic layer 6 includes a plurality of ferromagnetic metal crystal grains 35 formed of the ferromagnetic material. The crystal grains are separated by the non-magnetic oxides 34 and a part of the crystal grains of the plurality of ferromagnetic metal crystal grains 35 is contact with one or more crystal grains of the other adjacent crystal grains. Such a structure can be achieved when the oxide such as the oxide of Al, Si, Mg, or Ti, which is thermally stable and non-solid-soluble in the ferromagnetic material, and whose atomic radius is smaller than that of the ferromagnetic element is used as the non-magnetic material. The non-magnetic oxide 34 between the crystal grains has an ununiform thickness, and has a partial thin portion and pinholes. The thickness is preferably 2 nm or less. In such a structure, the ferromagnetic metal crystal grain 35 is not an isolated grain and a plurality of crystal grains contacts with each other in some place. The size and shape of the crystal grains are ununiform. The average crystal grain diameter can be estimated by X-ray diffractometer or an electron diffractometer. Through these measurements, it was found that the average diameter of the ferromagnetic metal crystal grains 35 in the composite magnetic layer 6 is 10 nm or less, unlike the usual ferromagnetic metal crystal grain (the average diameter is 15 to 30 nm). This is because a grain growth of the ferromagnetic metal crystal grain 35 is suppressed with the non-magnetic oxide 34.

The composite magnetic layer 6 in the second example is possible to be manufactured by the same method as the above-mentioned $CoFeTaO_x$. That is, when being manufactured by the reactive sputtering, the composition ratio of the ferromagnetic material and the non-magnetic material in the sputtering target is kept appropriate, the flow rate of oxygen is optimized so that the non-magnetic material is oxidize completely, and the most part of the ferromagnetic material is in a metal state. Thus, the deposition of the layer is achieved.

Also, when the ratio of the non-magnetic material to the ferromagnetic material in the sputtering target is increased, the ferromagnetic metal crystal grain 35 in the composite magnetic layer 6 becomes small, and the thickness of the non-magnetic oxide 34 between the grain boundaries increases. When the thickness of the non-magnetic oxide 34 becomes thick, the adjacent grains are separated from each other completely by the non-magnetic oxide 34, so that the coupling between the ferromagnetic metal crystal grains 35 is broken magnetically and electrically. At this time, the composite magnetic layer shows a super-paramagnetism due to thermal fluctuation, and becomes insulative. Therefore, the composition ratio of the sputtering target is determined such that the magnetic and electric coupling between the adjacent ferromagnetic metal crystal grains 35 are not broken, by adjusting the composition of the sputtering target and the flow rate of oxygen. The composition ratio of the non-magnetic material to the ferromagnetic material is preferably equal to or less than 40%.

As shown in FIG. 6, the composite magnetic layer 6 in the third example includes a plurality of pillar-shaped ferromagnetic metal crystal grains 35a and non-magnetic oxides 34a. The plurality of ferromagnetic metal crystal grains 35a are separated by the non-magnetic oxide 34a from each other. The crystal grain boundaries in the structure in the direction perpendicular to the film surface of the composite magnetic layer 6 are not separated by the nonmagnetic oxide 34a. Such a structure can be achieved when the thickness of the composite magnetic layer 6 is thinner than the size of the ferromagnetic metal crystal grain 35a, or when the ratio of the non-magnetic material to be mixed in the composite magnetic layer 6 is low (roughly the composition ratio of 10% or less). Any of oxides of Ta, Hf, Zr, Nb, Al, Si, Mg, and Ti can be applicable as the non-magnetic material.

In these composite magnetic layers 6, the anti-ferromagnetic layer 5 and the tunnel insulating layer 9 are not completely separated by the non-magnetic oxide 34a. However, a region, which is formed between the crystal grain boundaries in the pinned ferromagnetic layer 20, and through which Mn is diffused easily, is buried by the non-magnetic oxide 34a. Therefore, an enough effect of the diffusion prevention can be obtained. Also, the advantages of the composite magnetic layer 6 in the third example is in that simplification and thinning of the pinned ferromagnetic layer 20 can be obtained while keeping the prevention of the Mn diffusion. Also, it is in that the grain growth from the lower layer can be maintained. In this composite magnetic layer 6, the non-magnetic oxide 34 is segregated in the grain boundary. Therefore, the most portion of the interface contacted with the tunnel insulating layer 9 is the ferromagnetic metal crystal grains 35a even if the composite magnetic layer 6 is directly contact with the interface of the tunnel insulating layer 9. Thus, the high MR ratio can be maintained. It is not necessary to insert the metal ferromagnetic layer 7 between the composite magnetic layer 6 and the tunnel insulating layer 9, in order to keep the high MR ratio. Therefore, the pinned ferromagnetic layer 20 can be formed only from the composite magnetic layer 6. Moreover, the ferromagnetic metal crystal grains 35a in the composite magnetic layer 6 are not separated by the non-magnetic oxide 34a. Therefore, the crystal orientation can be transferred to the upper layer. This property is effective in a spin valve structure, in which the anti-ferromagnetic layer 5 is arranged above the tunnel insulating layer 9, since the composite magnetic layer 6 arranged below the anti-ferromagnetic layer 5 promotes the crystal orientation of the anti-ferromagnetic layer 5 and generates an excellent exchange bias characteristic.

In the measurement of a single-layer film of $CoFeTaO_x$ formed as mentioned above and a single-layer film of $CoFeAlO_x$ (formed by sputtering a $(Co_{90}Fe_{10})_{78}Al_{22}$ target (oxygen/argon flow rate ratio=0.07) in a mixture atmosphere of argon and oxygen), the resistivity is 85 μΩcm and 810 μΩcm, respectively. The magnetization measurement shows that the coercive forces are respectively 2 Oe and 5 Oe and ferromagnetic hysteresis curves are obtained in proper rectangular shapes. The result of the X-ray diffraction on these single-layer films shows that only a small diffraction peak due to the pillar-shaped crystalline region was observed in case of $CoFeTaO_x$, while the diffraction peaks of the face-centered cubic lattice were observed in case of $CoFeAlO_x$ and the average crystal grain diameter calculated from the half width using the Debye Sierra formula is approximately 6 nm. Consequently, the average diameter is 6 nm in the $CoFeAlO_x$ film and shows ferromagnetic properties and metal conductive properties. Therefore, it could be considered that the grains are partially contact with each other.

Figure 11:
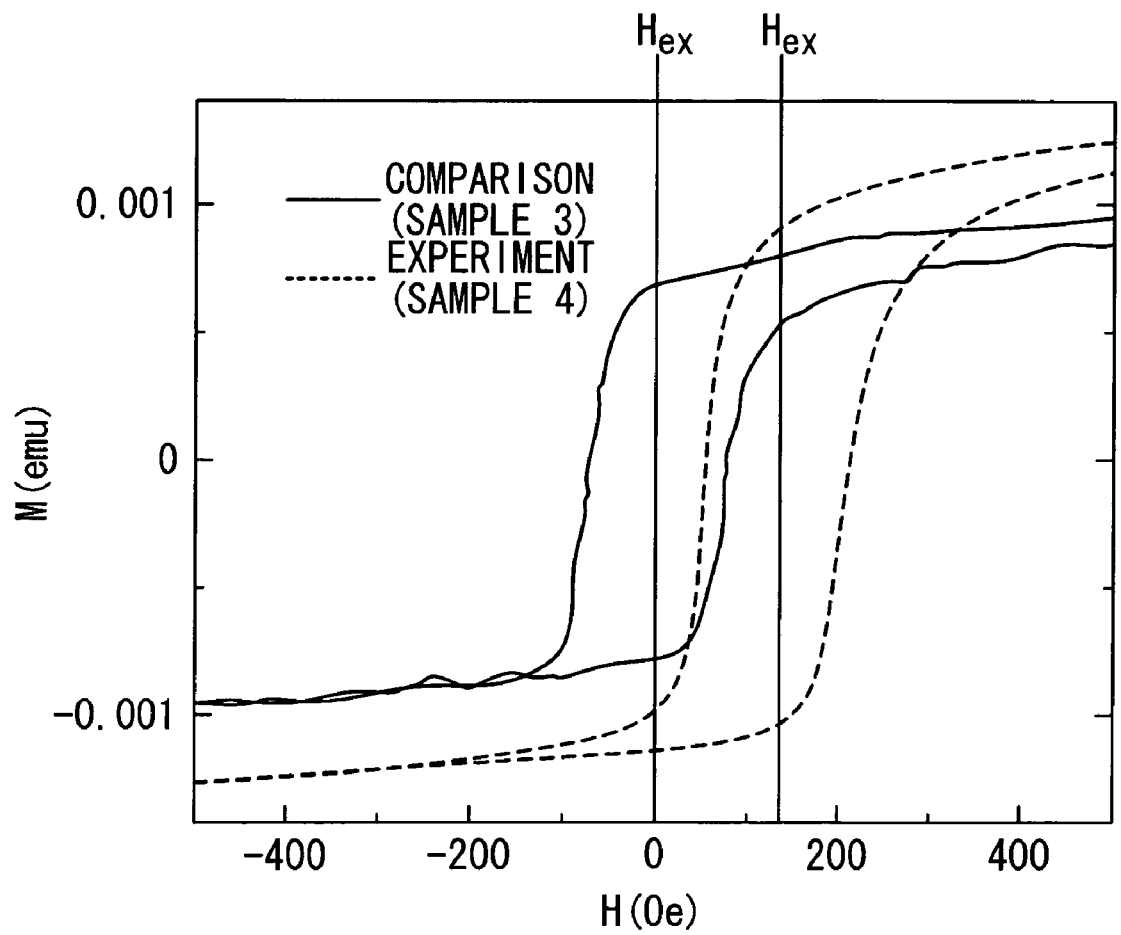
FIG. 11 is graphs showing magnetization curves of anti-ferromagnetic layer/pinned ferromagnetic layer—exchange coupling films.

FIG. 11 is a graph showing a magnetization curve of the exchange coupling film as the anti-ferromagnetic layer 5 containing the diffusion preventing layer/the pinned ferromagnetic layer 20. The vertical axis is magnetization, and the horizontal axis is magnetic field. Here, a sample 3 ("Comparison example" shown by the solid line in the graph) has the exchange coupling film including the pinned ferromagnetic layer 20 with a non-magnetic oxide layer of Ta (0.5 nm)-Ox as the diffusion preventing film (metal ferromagnetic layer 7/non-magnetic oxide layer/metal ferromagnetic layer 7). A sample 4 ("Experiment example" shown by the broken line in the graph) has the exchange coupling film including the pinned ferromagnetic layer 20 with a $CoFeTaO_x$ layer of the present invention as the composite magnetic layer 6 (composite magnetic layer 6/metal ferromagnetic layer 7). Thermal treatment is carried out on the samples in the magnetic field of 400° C.

Here, each sample will be described in the order of substrate/lower electrode seed layer/buffer layer/anti-ferromagnetic layer/non-oxidized amorphous film or composite magnetic layer/usual metal ferromagnetic layer/tunnel insulating layer (the lower electrode layer is omitted.)

(3) Sample 3 (Comparison Example to the Conventional Example)
Substrate/Ta (3 nm)/$Co_{90}Fe_{10}$ (3 nm)/$Pt_{49}Mn_{51}$ (30 nm)/$Co_{90}Fe_{10}$ (3 nm)/Ta (0.5 nm)-$O_x$/$Co_{90}Fe_{10}$ (5 nm)/Al (2 nm)-$O_x$ (4) Sample 4 (Experiment Example of the Present Invention)
Substrate/Ta (3 nm)/$Co_{90}Fe_{10}$ (3 nm)/$Pt_{49}Mn_{51}$ (30 nm)/$CoFeTaO_x$ (3 nm)/$Co_{90}Fe_{10}$ (5 nm)/Al (2 nm)-$O_x$ In the sample 3, the exchange coupling magnetic field becomes 0 Oe and the pinned layer is not fixed though the Ta—Ox (0.5 nm) layer is extremely thin. This could be considered as the result that the magnetic coupling is broken by Ta (0.5 nm)-Ox layer. On the other hand, in the sample 4 (the present invention), an exchange bias is generated in the pinned ferromagnetic layer 20 and the exchange coupling magnetic field Hex is 130 Oe. In the present invention, it is possible that the oxide (the composite magnetic layer 6) functioning as the diffusion preventing layer is contained in the pinned ferromagnetic layer 20 while keeping the magnetic coupling of the pinned ferromagnetic layer 20 and the anti-ferromagnetic layer 5.

The composite magnetic layer 15 can be similarly used to prevent the Ni diffusion from a Ni-based soft magnetic layer in the free ferromagnetic layer. However, when the composite magnetic layer 15 has soft ferromagnetism enough, the soft ferromagnetic layer 10 is not necessary in the third embodiment shown in FIG. 12. That is, the composite magnetic layer 15 (having the structure as shown in FIG. 4) is formed of metal ferromagnetic substance, which has been not oxidized, as a main component and oxide of a non-magnetic element easy to bind with oxygen compared with the metal ferromagnetic substance, as a sub component. In the composite magnetic layer 15, the ferromagnetic metal crystal grains become small and the crystal magnetic anisotropy decreases. For this reasons, it becomes relatively magnetically soft. In this case, Ni is not diffused into the tunnel insulating layer 9.

The composite magnetic layer 15 contains many non-magnetic elements. Therefore, there is a possibility that the MR ratio becomes small if the composite magnetic layer 15 is arranged directly on the tunnel insulating layer 9. For this reason, the high MR ratio is kept by arranging the metal ferromagnetic layer 8 between the composite magnetic layer 15 and the tunnel insulating layer 9. It is preferable that the metal ferromagnetic layer 8 is formed of a ferromagnetic alloy containing Co as the main component, and is typically formed of CoFe. The composite magnetic layer 15 is formed as a composite thin film mixed with a ferromagnetic substance without Ni (typically, CoFe), and the oxide of a non-magnetic metal. In the free ferromagnetic layer 21 having such a structure, the high MR ratio can be attained by arranging the metal ferromagnetic layer 8 formed of the material with high spin polarization and thermal stability directly on the tunnel insulating layer 9. In addition, the composite magnetic layer 15 soft magnetically affects the exchange interaction to the metal ferromagnetic layer 8 to make the metal ferromagnetic layer 8 soft, and as the result of this, the free ferromagnetic layer 21 is made to be soft wholly.

Also, in the composite magnetic layer 6 in the third example (the structure shown in FIG. 6), most of the elements that contact the boundary are a ferromagnetic element as mentioned above. Therefore, the composite magnetic layer 6 can be arranged directly on the boundary of the tunnel insulating layer 9, and the metal ferromagnetic layer 8 is not necessary in the above-mentioned case. In this case, the soft ferromagnetic layer 10 is formed of the ferromagnetic substance containing Ni, typically NiFe and is provided on the composite magnetic layer 15. The composite magnetic layer 15 as the above-mentioned composite thin film shows an effect of the prevention of Ni diffusion. Therefore, the diffusion of Ni contained in the soft ferromagnetic layer 10 into the tunnel insulating layer 9 can be prevented by the composite magnetic layer 15. The structure is preferable in that Ni can be prevented from diffusing into the tunnel insulating layer 9 while increasing the MR ratio.

By adopting the configuration of the magneto-resistance device shown in FIG. 12, it is possible to achieve the prevention of Ni diffusion from the soft magnetic layer at the same time as prevention of Mn diffusion. Thus, higher thermal resistance can be achieved. Since the same diffusion preventing layer can be used, the manufacturing method is easy even if the manufacturing cost is considered. In order to obtain the thermal resistance up to approximately 400° C. in the magneto-resistance device, the diffusion of Mn from the anti-ferromagnetic layer and Ni from the free ferromagnetic layer needs to be prevented at the same time, as mentioned above. Therefore, it is effective that the composite magnetic layer is provided as a diffusion preventing layer in the fixed ferromagnetic layer and the free ferromagnetic layer.

Experiment 1

The magneto-resistance device of the present invention having the above-mentioned configuration was manufactured by the above-mentioned method. The result of the experiment shows improvement of the thermal stability and the like due to the introduction of the composite magnetic film. That will be described below with reference to FIG. 15.

Figure 15:
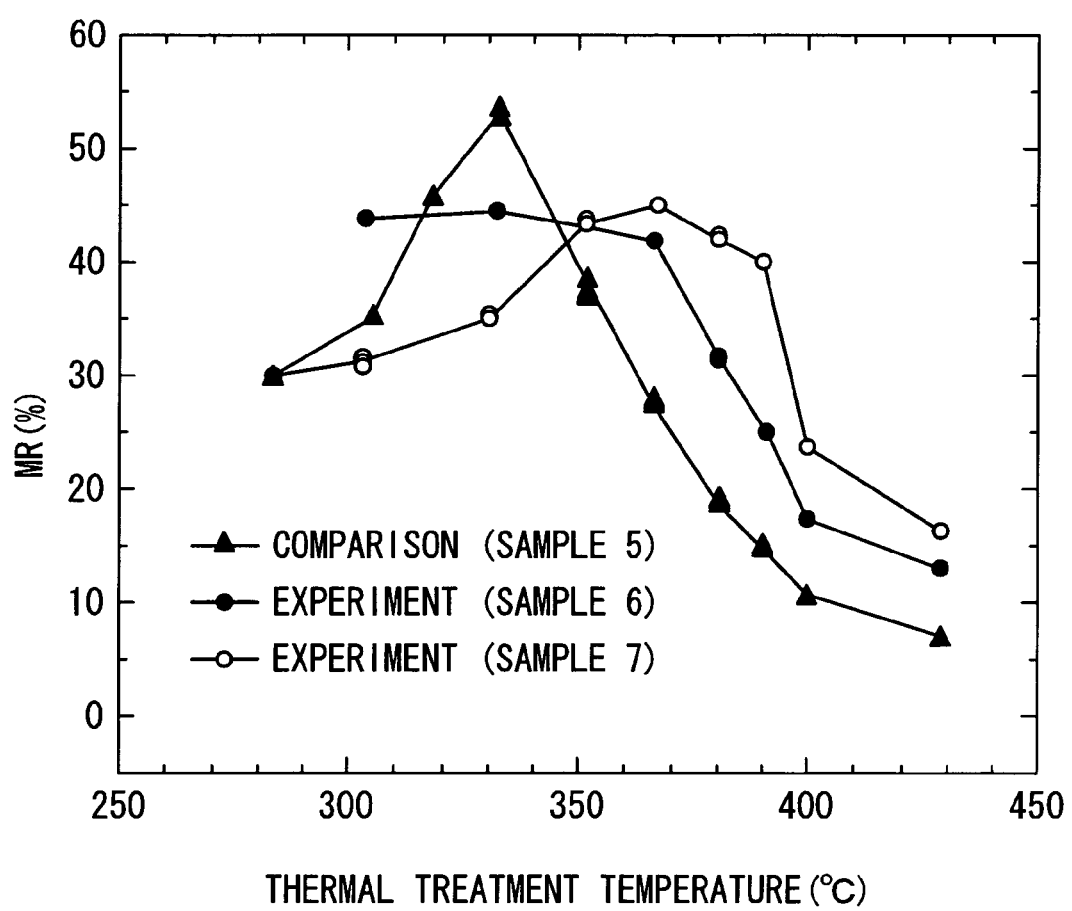
FIG. 15 is graphs showing relation of thermal treatment temperature and MR ratios in the magneto-resistance devices.

FIG. 15 is graphs showing the relation between thermal treatment temperature and MR ratio in the magneto-resistance device. The vertical axis shows the MR ratio (%), and the horizontal axis shows the thermal treatment temperatures (° C.). Here, each of samples will be described below.

(5) Sample 5 (Comparison Example to the Conventional Example)

Substrate/Ta (3 nm)/Cu (50 nm)/Ta (15 nm)/$Co_{90}Fe_{10}$ (3 nm)/$Pt_{49}Mn_{51}$ (30 nm)/$Co_{90}Fe_{10}$ (9 nm)/Al (2 nm)-O / $Co_{90}Fe_{10}$ (2. nm)/$Ni_{81}Fe_{19}$ (7.5 nm)/Ta (30 nm)/Cu (300 nm).

Here, the sample is formed in the order of substrate/lower electrode seed layer/lower electrode layer/buffer layer/anti-ferromagnetic layer/metal ferromagnetic layer/tunnel insulating layer/metal ferromagnetic layer/soft magnetic layer/electrode electric contact layer/upper electrode layer.

(6) Sample 6 (Experiment Example of the Present Invention)

Substrate/Ta (3 nm)/Cu (50 nm)/Ta (15 nm)/$Co_{90}Fe_{10}$ (3 nm)/$Pt_{49}Mn_{51}$ (30 nm)/$CoFeTaO_x$ (4 nm)/$Co_{90}Fe_{10}$ (5 nm)/ Al (2 nm) $O_x$/$Co_{90}Fe_{10}$ (2.5 nm)/$Ni_{81}Fe_{19}$ (7.5 nm)/Ta (30 nm)/Cu (300 nm).

Here, the sample is formed in the order of substrate/lower electrode seed layer/lower electrode layer/buffer layer/anti-ferromagnetic layer/composite magnetic layer/metal ferromagnetic layer/tunnel insulating layer/metal ferromagnetic layer/soft magnetic layer/electrode electric contact layer/upper electrode layer.

(7) Sample 7 (Example of Experimenting on the Present Invention)

Substrate/Ta (3 nm)/Cu (50 nm)/Ta (15 nm)/$Co_{90}Fe_{10}$ (3 nm)/$Pt_{49}Mn_{51}$ (30 nm)/$CoFeTaO_x$ (4 nm)/$Co_{90}Fe_{10}$ (5 nm)/ Al (2 nm)-$O_x$/$Co_{90}Fe_{10}$ (1 nm)/$CoFeTaO_x$ (3 nm)/$Ni_{81}Fe_{19}$ (7.5 nm)/Ta (30 nm)/Cu (300 nm)

Here, the sample is formed in the order of substrate/lower electrode seed layer/lower electrode layer/buffer layer/anti-ferromagnetic layer/composite magnetic layer/metal ferromagnetic layer/tunnel insulating layer/metal ferromagnetic layer/composite magnetic layer/soft magnetic layer/electrode electric contact layer/upper electrode layer.

The composite magnetic layer $CoFeTaO_x$ in these samples is formed by reactive sputtering (the oxygen/argon flow rate ratio=0.13) by using the alloy target of $(Co_{90}Fe_{10})_{85}Ta_{15}$. It was confirmed that the resistivity of this composite magnetic film is 85 μΩcm and coercive force is 25 Oe of the ferromagnetic by a sheet resistance measurement and a magnetic measurement.

The sample 5 is the conventional exchange bias type magneto-resistance device. The sample 6 is the magneto-resistance device of the present invention in which the diffusion of Mn is prevented by using the $CoFeTaO_x$ composite magnetic layer 6. The sample 7 is the magneto-resistance device of the present invention in which the diffusion of Mn and Ni is prevented by using the CoFeTaOx composite magnetic layers 6 and 15 in the pinned ferromagnetic layer and the free ferromagnetic layer.

In the sample 5, the MR ratio becomes the maximum of 53% at 330° C. However, the MR ratio decreases rapidly at higher temperature. On the other hand, in the sample 6, the MR ratio is kept steadily to 40% or more at up to 365° C., and the thermal resistance is improved. This is the effect of the composite magnetic layer $CoFeTaO_x$ that prevents the Mn diffusion from the anti-ferromagnetic layer.

The sample 7 further improves the thermal resistance, and the MR ratio is kept to 40% or more up to at 390° C. This could be considered as the effect of the prevention of diffusion of Ni from the free ferromagnetic layer in addition to the prevention of diffusion of Mn from the anti-ferromagnetic layer.

Figure 16:
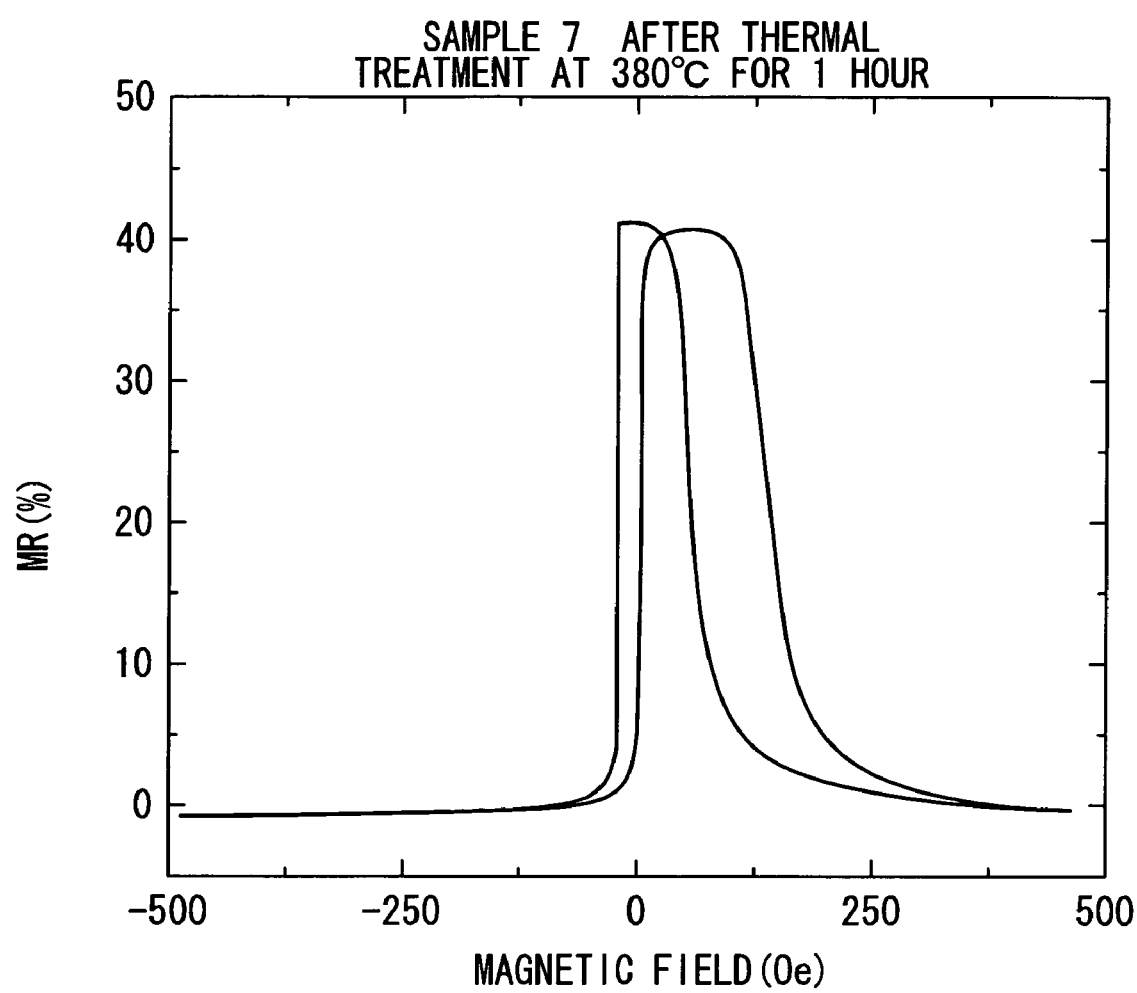
FIG. 16 is graphs showing magneto-resistance curves after thermal treatment of the magneto-resistance devices.

FIG. 16 is graphs showing a magneto-resistance curve of the sample 7 after the thermal treatment for one hour at 380° C. The vertical axis shows a MR ratio (%) and the horizontal axis shows a magnetic field (Oe). As seen clearly from FIG. 16, the MR-curve of an excellent spin valve type can be achieved and there is no problem in the magnetic property. In this way, in the magneto-resistance device of the present invention, in which the composite magnetic layers 6 and 15 are used in the pinned ferromagnetic layer and the free ferromagnetic layer, the thermal resistance is improved greatly, and thermal resistance of 390° C. at maximum was achieved.

Experiment 2

The magneto-resistance device is manufactured by the same method as the experiment example 1 to contain the $CoFeAlO_x$ composite magnetic layer 6 in the pinned ferromagnetic layer 20. The film structure will be described below with reference to FIG. 17.

FIG. 17 is a table showing relation between MR ratio and exchange coupling magnetic field. Here, each of samples is as follows.

(8) Sample 8 (Comparison Example to the Conventional Example)

Substrate/Ta (30 nm)/$Ni_{81}Fe_{19}$ (3 nm)/$Ir_{20}Mn_{80}$ (10 nm)/$Co_{90}Fe_{10}$ (12 nm)/Al (2 nm)-$O_x$/$Co_{90}Fe_{10}$ (2.5 nm)/$Ni_{81}Fe_{19}$ (7.5 nm)/Ta (30 nm)/Cu (300 nm).

Here, the sample was formed in the order of substrate/lower electrode seed layer/buffer layer/anti-ferromagnetic layer/metal ferromagnetic layer/tunnel insulating layer/metal ferromagnetic layer/soft magnetic layer/electrode electric contact layer/upper electrode layer (the lower electrode layer is omitted).

(9) Sample 9 (Experiment Example of the Present Invention)

Substrate/Ta (30 nm)/$Ni_{81}Fe_{19}$ (3 nm)/$Ir_{20}Mn_{80}$ (10 nm)/$Co_{90}Fe_{10}$ (1.5 nm)/$CoAlO_x$[A] (8 nm)/$Co_{90}Fe_{10}$ (1.5 nm)/Al (2 nm)-$O_x$/$Co_{90}Fe_{10}$ (2.5 nm)/$Ni_{81}Fe_{19}$ (7.5 nm)/Ta (30 nm)/Cu (300 nm).

Here, the sample was formed in the order of substrate/lower electrode seed layer/buffer layer/anti-ferromagnetic layer/metal ferromagnetic layer/composite magnetic layer/metal ferromagnetic layer/tunnel insulating layer/metal ferromagnetic layer/soft magnetic layer/electrode electric contact layer/upper electrode layer (the lower electrode layer is omitted).

(10) Sample 10 (Experiment Example of the Present Invention)

Substrate/Ta (30 nm)/$Ni_{81}Fe_{19}$ (3 nm)/$Ir_{20}Mn_{80}$ (10 nm)/$CoFeAlO_x$[B] (6 nm)/Al (2 nm)-$O_x$/$Co_{90}Fe_{10}$ (2.5 nm)/$Ni_{81}Fe_{19}$ (7.5 nm)/Ta (30 nm)/Cu (300 nm).

Here, the sample was manufactured in the order of substrate/lower electrode seed layer/buffer layer/anti-ferromagnetic layer/composite magnetic layer/tunnel insulating layer/metal ferromagnetic layer/soft magnetic layer/electrode electric contact layer/upper electrode layer (the lower electrode layer is omitted).

The $CoFeAlO_x$ composite magnetic layer A used in the sample 9 was manufactured by the reactive sputtering (the oxygen/argon flow rate ratio=0.07) by using the $(Co_{90}Fe_{10})_{78}Al_{22}$ sputtering target as described above. As the result of the X-ray diffraction measurement, the average crystal grain diameter is 6 nm, the resistivity is 810 μΩcm showing electrical conductivity, and the coercive force is 5 Oe showing a ferromagnetic hysteresis curve in a proper rectangular shape.

On the other hand, the CoFeAlOx composite magnetic layer B of the sample 10 was manufactured by the reactive sputtering (the oxygen/argon flow rate ratio=0.035) by using the alloy target of $(Co_{90}Fe_{10})_{95}Al_5$. This $CoFeAlO_x$ shows a ferromagnetic hysteresis with the coercive force of 30 Oe (magnetic measurement), and the resistivity is 20 μΩcm.

The table in FIG. 17 shows relation of MR ratio and the exchange coupling magnetic field of these magneto-resistance devices (the samples 8 to 10) in thermal treatments at 250° C., 300° C., 350° C., and 400° C. The conventional spin valve magneto-resistance device (the sample 8) has the high MR ratio of 42% at 250° C. However, the ratio of the conventional spin valve magneto-resistance device (the sample 8) is rapidly decreased in the higher temperature, and the thermal resistance is the worst.

On the other hand, in the sample 9 as the magneto-resistance device of the present invention, the $CoAlO_x$ composite magnetic layer A is inserted in the pinned ferromagnetic layer 20 to prevent the Mn diffusion. Therefore, even after the thermal treatment in a range of 250 to 350° C., the MR ratio is stably kept to a high value. Moreover, the exchange bias magnetic field of 80 to 92 Oe is also generated. In the sample 10 as the magneto-resistance device of the present invention, only the $CoFeAlO_x$ composite magnetic layer is used as the pinned ferromagnetic layer 20 without the metal ferromagnetic layer 7. Even in this case, the MR ratio takes a high value of 40%. Since the pinned ferromagnetic layer 20 is thin, the exchange coupling magnetic field of 200 Oe or more is generated. Moreover, the thermal resistance is also high, and the MR ratio is maintained to the value of 33% even after the thermal treatment at 350° C. By using the composite magnetic layer of the present invention for the pinned ferromagnetic layer 20, the exchange coupling between the anti-ferromagnetic layer 5 and the pinned ferromagnetic layer 20 is kept, and the Mn diffusion from the anti-ferromagnetic layer 5 can be prevented so that the thermal resistance can be improved.

Experiment 3

The experimental example 3 of the anti-ferromagnetic coupling film using the composite magnetic layer will be described. The samples were manufactured, in which the $Co_{90}Fe_{10}$ (6 nm) metal ferromagnetic layer and the $CoFeTaO_x$ (5 nm) composite magnetic layer are ferromagnetically or anti-ferromagnetically coupled. The composite magnetic layer $CoFeTaO_x$ (6 nm) was formed by the reactive sputtering (the oxygen/argon flow rate ratio=0.13) by using the alloy target of $(Co_{90}Fe_{10})_{85}Ta_{15}$ in a mixture atmosphere of argon and oxygen, and was the same film as the experiment example 1. After the film growth, thermal treatment at 300° C. was carried out on the sample in the magnetic field to give the magnetic anisotropy. Those magnetization curves (vibratory magnetometer) are described with reference to FIG. 18.

Figure 18:
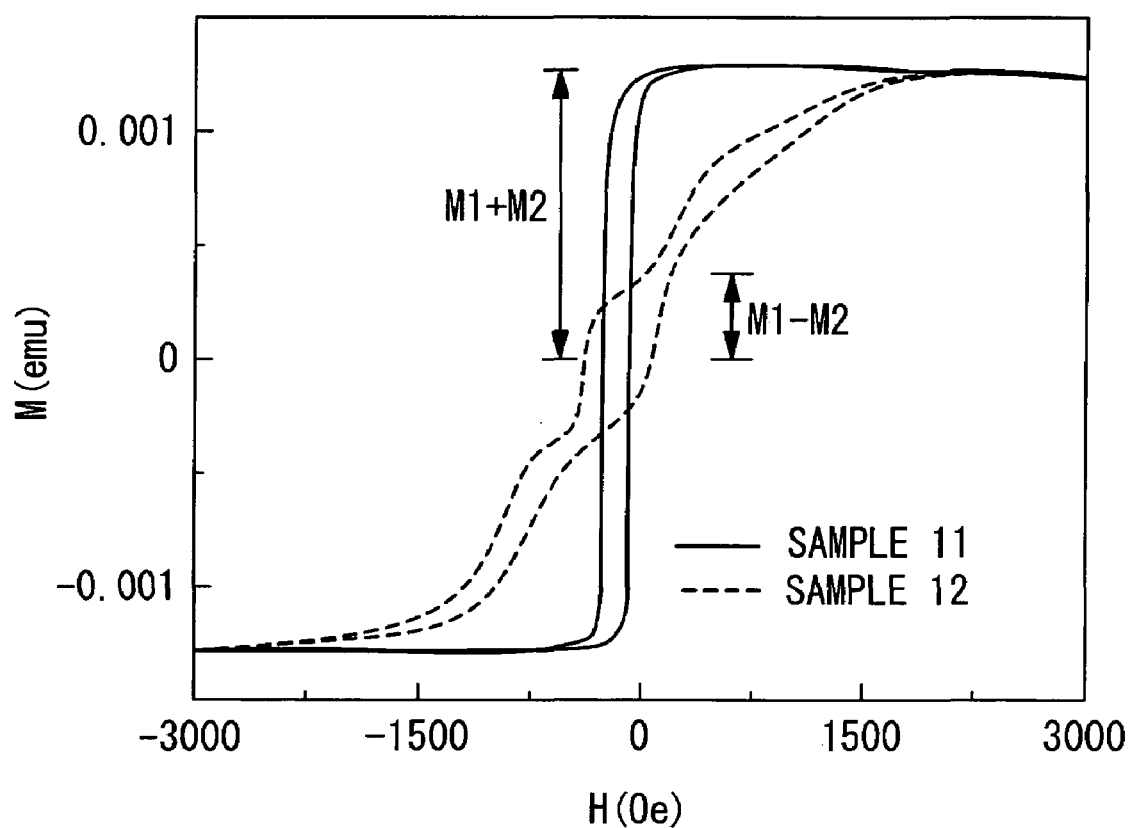
FIG. 18 is graphs showing the magnetization curve of each sample.

FIG. 18 is a graph showing magnetization curve of each of the samples. The vertical axis shows magnetization (emu) and the horizontal axis shows magnetic field (Oe). Here, each sample was formed as follows.

(11) Sample 11 (Experiment Example of the Present Invention)

Substrate/Ta (1.5 nm)/$Co_{90}Fe_{10}$ (6 nm)/$CoFeTaO_x$ (5 nm)/Al (2 nm)-$O_x$.

Here, the sample was manufactured in the order of substrate/lower electrode seed layer/metal ferromagnetic layer/composite magnetic layer/tunnel insulating layer.

(12) Sample 12 (Experiment Example of the Present Invention)

Substrate/Ta (1.5 nm)/$Co_{90}Fe_{10}$ (6 nm)/Ru (1.0 nm)/$CoFeTaO_x$ (5 nm)/Al (2 nm)-$O_x$.

Here, the sample was manufactured in the order of substrate/lower electrode seed layer/metal ferromagnetic layer/non-magnetic layer/composite magnetic layer/tunnel insulating layer.

The sample 11 is a laminated film in which a $Co_{90}Fe_{10}$ film (6 nm) and a $CoFeTaO_x$ film (5 nm) are laminated directly and ferromagnetically coupled. In the sample 12, a $Co_{90}Fe_{10}$ film (6 nm) and a $CoFeTaO_x$ film (5 nm) are laminated through a Ru film (1 nm), and two magnetic layers are anti-ferromagnetically coupled by the effect of the Ru film (1 nm). M1 and M2 shown in FIG. 18 are saturation magnetizations of the $Co_{90}Fe_{10}$ film (6 nm) and the $CoFeTaO_x$ film (5 nm), respectively.

In the sample 11, a ferromagnetic hysteresis in a proper rectangular shape can be observed, and the height is M1+M2 (a summation of the saturation magnetizations in two layers). In the sample 12, a small hysteresis is observed in the magnetic field of approximately 0, and a magnetization curve without linear hysteresis is observed in a high magnetic field. This is because the magnetizations of the $Co_{90}Fe_{10}$ film (6 nm) and the $CoFeTaO_x$ film (5 nm) are anti-ferromagnetically coupled. The height of the ferromagnetic hysteresis in the magnetic field of approximately 0 is M1−M2 as the difference between the saturation magnetizations of both the ferromagnetic layers. When the applied magnetic field is increased to a higher value, the anti-ferromagnetic coupling of these $Co_{90}Fe_{10}$ film (6 nm) and $CoFeTaO_x$ film (5 nm) are broken. When the magnetic field of approximately 2300 Oe is applied, both the ferromagnetic layers become ferromagnetically coupled. By using the anti-ferromagnetic coupling film as in the sample 12, an effective magnetization can be reduced from M1+M2 to M1−M2 in the low magnetic field. By using the anti-ferromagnetic coupling film for the free ferromagnetic layer or the pinned ferromagnetic layer of the magneto-resistance device so that the magnetization of the pinned ferromagnetic layer or the free ferromagnetic layer is decreased, the increase of the dematnetization field or the static magnetic field can be restricted. Thus, the problem concerning to magnetizing in an MRAM device can be solved.

In the present invention, the diffusion preventing layer is provided in the magneto-resistance element. Therefore, Mn and Ni diffusion from the Mn-based anti-ferromagnetic layer and Ni-based free ferromagnetic layer into the tunnel insulating layer can be prevented. Further, the problems can be solved such as the increase of the additional resistance due to addition of the diffusion preventing layer, and the decrease of the magnetic coupling in the pinned ferromagnetic layer and the free ferromagnetic layer. Thus, compared with the conventional technique, the magnetic tunnel device with higher thermal resistance can be manufactured at lower cost. The improvement of the thermal resistance of the magneto-resistance device contributes to improvement of the reliability and the thermal stability of the magnetic memory device using the magneto-resistance device. Moreover, a manufacturing process margin extends in the magnetic memory device with the magneto-resistance device, and it is possible to manufacture devices with higher performance.

The invention claimed is:

1. A magneto-resistance device comprising:
an anti-ferromagnetic layer;
a pinned ferromagnetic layer having a fixed spontaneous magnetization and coupled with said anti-ferromagnetic layer;
a non-magnetic tunnel insulating layer coupled with said pinned ferromagnetic layer; and
a free ferromagnetic layer coupled with said tunnel insulating layer and having a reversible free spontaneous magnetization,
wherein said pinned ferromagnetic layer comprises a first composite magnetic layer configured to prevent at least one of elements of said anti-ferromagnetic layer from diffusing into said tunnel insulating layer, and materials forming the first composite magnetic layer are intermixed according to a composition ratio, and wherein said first composite magnetic layer comprises ferromagnetic material that has been not oxidized; and an oxide of a material which is easy to combine with oxygen compared with said ferromagnetic material.

2. The magneto-resistance device according to claim 1, wherein said anti-ferromagnetic layer contains Mn, and
said first composite magnetic layer prevents said Mn from diffusing into said tunnel insulating film.

3. The magneto-resistance device according to claim 1, wherein said materials intermixed according to said composition ratio make up a single composite magnetic layer.

4. The magneto-resistance device according to claim 1, wherein said ferromagnetic material contains Co in as a main component.

5. The magneto-resistance device according to claim 1, wherein said first composite magnetic layer is formed from a region of an amorphous phase as a whole or from a region of said amorphous phase and a region of a crystalline phase.

6. The magneto-resistance device according to claim 5, wherein said crystalline phase region contains a plurality of crystal regions, and
said plurality of crystal regions pass through said first composite magnetic layer into a direction of a thickness of said first composite magnetic layer.

7. The magneto-resistance device according to claim 5, wherein a composition of said amorphous phase in said first composite magnetic layer is $D_ZM_{1-Z}O_X$ ($0.6 \leq Z \leq 0.9$, and $X>0$), said D is at least one selected from the group consisting of Co, Fe and Ni, and said M is at least one selected from the group consisting of Ta, Zr, Hf, Nb, and Ce.

8. The magneto-resistance device according to claim 1, wherein said pinned ferromagnetic layer further comprises a first metal ferromagnetic layer and a second metal ferromagnetic layer, and said first composite magnetic layer is interposed between said first metal ferromagnetic layer and said second metal ferromagnetic layer.

9. The magneto-resistance device according to claim 1, wherein a resistivity of said first composite magnetic layer is in a range of 10 μΩcm to 3000 μΩcm.

10. The magneto-resistance device according to claim 1, wherein said pinned ferromagnetic layer comprises:

a non-magnetic layer; and two ferromagnetic layers anti-ferromagnetically coupled to each other through said non-magnetic layer.

11. A magneto-resistance device comprising:

an anti-ferromagnetic layer;

a pinned ferromagnetic layer having a fixed spontaneous magnetization and coupled with said anti-ferromagnetic layer;

a non-magnetic tunnel insulating layer coupled with said pinned ferromagnetic layer; and a free ferromagnetic layer coupled with said tunnel insulating layer and having a reversible free spontaneous magnetization, wherein said pinned ferromagnetic layer comprises a first composite magnetic layer configured to prevent at least one of elements of said anti-ferromagnetic layer from diffusing into said tunnel insulating layer, and materials forming the first composite magnetic layer are intermixed according to a composition ratio, and wherein said first composite magnetic layer contains a plurality of crystal grains comprising ferromagnetic material, said plurality of crystal grains are separated from each other by oxide, and a part of said plurality of crystal grains contacts an adjacent one of said plurality of crystal grains.

12. The magneto-resistance device according to claim 11, wherein said oxide comprises oxide of at least an element selected from the group consisting of Al, Si, Mg and Ti.

13. The magneto-resistance device according to claim 11, wherein a thickness of said oxide is thinner than a grain diameter of each of said plurality of crystal grains.

14. The magneto-resistance device according to claim 13, wherein the thickness of said oxide is equal to or less than 2 nm.

15. The magneto-resistance device according to claim 14, wherein an average grain diameter of said plurality of crystal grains is equal to or less than 10 nm.

16. The magneto-resistance device according to claim 11, wherein ferromagnetic coupling is kept between said plurality of crystal grains.

17. A magneto-resistance device comprising:

an anti-ferromagnetic layer;

a pinned ferromagnetic layer having a fixed spontaneous magnetization and coupled with said anti-ferromagnetic layer;

a non-magnetic tunnel insulating layer coupled with said pinned ferromagnetic layer; and a free ferromagnetic layer coupled with said tunnel insulating layer and having a reversible free spontaneous magnetization, wherein said pinned ferromagnetic layer comprises a first composite magnetic layer configured to prevent at least one of elements of said anti-ferromagnetic layer from diffusing into said tunnel insulating layer, and materials forming the first composite magnetic layer are intermixed according to a composition ratio, and wherein said first composite magnetic layer contains a plurality of crystal grains comprising ferromagnetic material, and said plurality of crystal grains are separated from each other by oxide and pass through said first composite magnetic layer into a direction of a thickness of said first composite magnetic layer.

18. The magneto-resistance device according to claim 17, wherein a part of said plurality of crystal grains contacts an adjacent one of said plurality of crystal grains.

19. The magneto-resistance device according to claim 17, wherein said oxide comprises oxide of at least an element selected from the group consisting of Al, Si, Mg, Ti, Ta, Hf, Zr, Nb and Ce.

20. A magneto-resistance device comprising:

an anti-ferromagnetic layer;

a pinned ferromagnetic layer having a fixed spontaneous magnetization and coupled with said anti-ferromagnetic layer;

a non-magnetic tunnel insulating layer coupled with said pinned ferromagnetic layer; and a free ferromagnetic layer coupled with said tunnel insulating layer and having reversible free spontaneous magnetization, wherein said pinned ferromagnetic layer comprises a first composite magnetic layer configured to prevent at least one of elements of said anti-ferromagnetic layer from diffusing into said tunnel insulating layer, and materials forming the first composite magnetic layer are intermixed according to a composition ratio, and wherein said free ferromagnetic layer comprises a second composite magnetic layer configured to prevent at least one elements of said free ferromagnetic layer from diffusing into said tunnel insulating layer.

21. The magneto-resistance device according to claim 20, wherein said free ferromagnetic layer contains Ni, and said second composite magnetic layer prevents said Ni from diffusing into said tunnel insulating film.

22. The magneto-resistance device according to claim 21, wherein said free ferromagnetic layer comprises:

a metal ferromagnetic layer provided between said tunnel insulating layer and said second composite magnetic layer; and a soft magnetic layer containing said Ni and connected to said second composite magnetic layer on an opposite side to said metal ferromagnetic layer.

23. The magneto-resistance device according to claim 20, wherein said free ferromagnetic layer comprises:

a non-magnetic layer; and two ferromagnetic layers anti-ferromagnetically coupled through said non-magnetic layer.

24. A magnetic memory comprising a magneto-resistance device which comprises:

an anti-ferromagnetic layer;

a pinned ferromagnetic layer having a fixed spontaneous magnetization and coupled with said anti-ferromagnetic layer;

a non-magnetic tunnel insulating layer coupled with said pinned ferromagnetic layer; and a free ferromagnetic layer coupled with said tunnel insulating layer and having a reversible free spontaneous magnetization, wherein said pinned ferromagnetic layer comprises a first composite magnetic layer configured to prevent at least one of elements of said anti-ferromagnetic layer from diffusing into said tunnel insulating layer, and wherein materials forming the first composite magnetic layer are intermixed according to a composition ratio, and wherein said free ferromagnetic layer comprises a second composite magnetic layer configured to prevent at least one elements of said free ferromagnetic layer from diffusing into said tunnel insulating layer.

* * * * *

UNITED STATES PATENT AND TRADEMARK OFFICE
CERTIFICATE OF CORRECTION

| | | |
|---|---|---|
| PATENT NO. | : 7,379,280 B2 | Page 1 of 1 |
| APPLICATION NO. | : 10/539373 | |
| DATED | : May 27, 2008 | |
| INVENTOR(S) | : Yoshiyuki Fukumoto, Ken-ichi Shimura and Atsushi Kamijo | |

It is certified that error appears in the above-identified patent and that said Letters Patent is hereby corrected as shown below:

Drawing, Fig. 8, left side of drawing before "(emu/cc)", change "SATURATED OXIDE" to -- SATURATION MAGNETIZATION --.

Signed and Sealed this

Thirty-first Day of March, 2009

JOHN DOLL
*Acting Director of the United States Patent and Trademark Office*